United States Patent
Pun et al.

(10) Patent No.: US 12,125,806 B2
(45) Date of Patent: Oct. 22, 2024

(54) ELECTRONIC DEVICE PACKAGES WITH INTERNAL MOISTURE BARRIERS

(71) Applicant: Wolfspeed, Inc., Durham, NC (US)

(72) Inventors: Arthur Pun, Raleigh, NC (US); Basim Noori, San Jose, CA (US)

(73) Assignee: Wolfspeed, Inc., Durham, NC (US)

( * ) Notice: Subject to any disclaimer, the term of this patent is extended or adjusted under 35 U.S.C. 154(b) by 0 days.

(21) Appl. No.: 18/219,422

(22) Filed: Jul. 7, 2023

(65) Prior Publication Data
US 2023/0352425 A1 Nov. 2, 2023

Related U.S. Application Data

(63) Continuation of application No. 17/078,456, filed on Oct. 23, 2020, now Pat. No. 11,742,302.

(51) Int. Cl.
*H01L 23/31* (2006.01)
*H01L 21/48* (2006.01)
(Continued)

(52) U.S. Cl.
CPC ........ *H01L 23/564* (2013.01); *H01L 21/4817* (2013.01); *H01L 21/4825* (2013.01);
(Continued)

(58) Field of Classification Search
CPC ... H01L 23/564; H01L 23/047; H01L 23/293; H01L 23/296; H01L 23/3114;
(Continued)

(56) References Cited

U.S. PATENT DOCUMENTS

| | | |
|---|---|---|
| 5,600,181 A | 2/1997 | Scott |
| 6,316,793 B1 | 11/2001 | Sheppard et al. |

(Continued)

FOREIGN PATENT DOCUMENTS

| | | |
|---|---|---|
| JP | 1988140554 A | 6/1988 |
| JP | 1993283561 A | 10/1993 |

(Continued)

OTHER PUBLICATIONS

Sun, Jiazhen et al., "Modification of Polytetrafluoroethylene by Radiation-1. Improvement in High Temperature Properties and Radiation Stability," Radiat. Phys. Chem., vol. 44, No. 6, 1994, pp. 655-659.

(Continued)

*Primary Examiner* — Peniel M Gumedzoe
(74) *Attorney, Agent, or Firm* — Sage Patent Group

(57) ABSTRACT

A method of packaging an RF transistor device includes attaching one or more electronic devices to a carrier substrate, applying an encapsulant over at least one of the one or more electronic devices, and providing a protective structure on the carrier substrate over the one or more electronic devices. A packaged RF transistor device includes a carrier substrate, one or more electronic devices attached to the carrier substrate, an encapsulant material over at least one of the one or more electronic devices and extending onto the carrier substrate, and a protective structure on the carrier substrate over the one or more electronic devices and the encapsulant material.

19 Claims, 14 Drawing Sheets

(51) Int. Cl.
- *H01L 21/56* (2006.01)
- *H01L 23/00* (2006.01)
- *H01L 23/047* (2006.01)
- *H01L 23/29* (2006.01)
- *H01L 23/495* (2006.01)
- *H01L 23/66* (2006.01)

(52) U.S. Cl.
CPC .......... *H01L 21/565* (2013.01); *H01L 23/047* (2013.01); *H01L 23/293* (2013.01); *H01L 23/296* (2013.01); *H01L 23/3114* (2013.01); *H01L 23/49513* (2013.01); *H01L 23/4952* (2013.01); *H01L 23/49562* (2013.01); *H01L 23/49575* (2013.01); *H01L 23/66* (2013.01); *H01L 2223/6683* (2013.01)

(58) Field of Classification Search
CPC .......... H01L 23/49513; H01L 23/4952; H01L 23/49562; H01L 23/49575; H01L 23/66; H01L 2223/6683

See application file for complete search history.

(56) References Cited

U.S. PATENT DOCUMENTS

| | | | |
|---|---|---|---|
| 6,921,929 | B2 | 7/2005 | LeBouf et al. |
| 7,263,294 | B2 | 8/2007 | Horio |
| 7,906,799 | B2 | 3/2011 | Sheppard et al. |
| 8,223,500 | B2 * | 7/2012 | Yamada ............... G06K 19/077 257/679 |
| 8,338,933 | B2 | 12/2012 | Chen |
| 9,293,407 | B2 | 3/2016 | Komposch et al. |
| 2002/0066908 | A1 | 6/2002 | Smith |
| 2002/0167023 | A1 | 11/2002 | Chavarkar et al. |
| 2003/0102482 | A1 | 6/2003 | Saxler |
| 2004/0061129 | A1 | 4/2004 | Saxler et al. |
| 2005/0282310 | A1 * | 12/2005 | Zhou ....................... H01L 24/83 438/107 |
| 2006/0148317 | A1 * | 7/2006 | Akaike ............... H01R 13/6594 439/607.01 |
| 2006/0221591 | A1 | 10/2006 | Kong |
| 2009/0146169 | A1 | 6/2009 | Woo et al. |
| 2009/0302439 | A1 | 12/2009 | Pagaila et al. |
| 2012/0094442 | A1 | 4/2012 | Lin et al. |
| 2012/0280755 | A1 | 11/2012 | Wright |
| 2012/0313296 | A1 | 12/2012 | Drysdale |
| 2015/0001689 | A1 | 1/2015 | Goetz |
| 2015/0332938 | A1 | 11/2015 | Palm et al. |
| 2017/0092611 | A1 | 3/2017 | Adema |
| 2017/0294387 | A1 | 10/2017 | Kawabata et al. |
| 2018/0269181 | A1 | 9/2018 | Yang et al. |
| 2019/0013289 | A1 | 1/2019 | Fang et al. |
| 2019/0304934 | A1 | 10/2019 | Kamphuis et al. |
| 2019/0326234 | A1 * | 10/2019 | Benson ................... H01L 23/66 |
| 2020/0135605 | A1 | 4/2020 | Yu |

FOREIGN PATENT DOCUMENTS

| | | |
|---|---|---|
| JP | 2000340718 A | 12/2000 |
| JP | 2005101580 A | 4/2005 |
| JP | 2009289920 A | 12/2009 |
| WO | 2018159678 A1 | 9/2018 |

OTHER PUBLICATIONS

Wikipedia, "Polytetrafluoroethylene," accessed via the Internet in Aug. 10, 2020 at the following link:https://en.wikipedia.org/wiki/Polytetraflurethylene, 11 pages.

PTFE Applied Coatings, "PTFE Coating Process," accessed via the Internet on Aug. 10, 2020 at the following link: https://fluroprecision.co.uk/ptfe/ptfe-technical-information/ptfe-coating-process, 2 pages.

PTFE Applied Coatings, "PTFE The Mechanics," accessed via the Internet on Aug. 10, 2020 at the following link: https://www.fluroprecision.co.uk/ptfe/ptfe-the-mechanics, 2 pages.

International Search Report and Written Opinion of the International Searching Authority, PCT/US2021/0056366, mailed Jan. 24, 2022, 23 pages.

English Machine Translation of JP 4545956, published Sep. 15, 2010, (Authors names could not be translated in English characters by PE2ESEARCH).

First Japanese Office Action dated Apr. 16, 2024 for Japanese Patent Application No. JP 2023-524327, 6 pages (including English translation).

Extended European Search Report for EP Application No. 21884043.7 mailed Aug. 26, 2024, 21 pages.

\* cited by examiner

ELECTRONIC DEVICE PACKAGES WITH INTERNAL MOISTURE BARRIERS

CROSS-REFERENCE TO RELATED APPLICATIONS

The present application is a continuation U.S. application Ser. No. 17/078,456, entitled "ELECTRONIC DEVICE PACKAGES WITH INTERNAL MOISTURE BARRIERS," filed Oct. 23, 2020, the disclosure of which is incorporated herein by reference in its entirety.

BACKGROUND

Electrical circuits requiring high power handling capability while operating at high frequencies, such as R-band (0.5-1 GHZ), S-band (3 GHZ), X-band (10 GHZ), Ku-band (12-18 GHz), K-band (18-27 GHZ), Ka-band (27-40 GHZ) and V-band (40-75 GHZ) have become more prevalent. In particular, there is now high demand for RF transistor amplifiers that are used to amplify RF signals at frequencies of, for example, 500 MHz and higher (including microwave frequencies). These RF transistor amplifiers often need to exhibit high reliability, good linearity and handle high output power levels.

RF transistor amplifiers may be implemented in silicon or wide bandgap semiconductor materials, such as silicon carbide ("SiC") and Group Ill nitride materials. Herein, the term "wide bandgap" refers to semiconductor materials having a bandgap of greater than 1.40 eV. As used herein, the term "Group III nitride" refers to those semiconducting compounds formed between nitrogen and the elements in Group Ill of the periodic table, usually aluminum (Al), gallium (Ga), and/or indium (In). The term also refers to ternary and quaternary compounds, such as AlGaN and AllnGaN. These compounds have empirical formulas in which one mole of nitrogen is combined with a total of one mole of the Group III elements.

Silicon-based RF transistor amplifiers are typically implemented using laterally diffused metal oxide semiconductor ("LDMOS") transistors. Silicon LDMOS RF transistor amplifiers can exhibit high levels of linearity and may be relatively inexpensive to fabricate. Group III nitride-based RF transistor amplifiers are typically implemented as High Electron Mobility Transistors ("HEMT") and are primarily used in applications requiring high power and/or high frequency operation where LDMOS RF transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

RF transistor amplifiers often include matching circuits, such as (1) impedance matching circuits that are designed to improve the impedance match (for RF signals at the fundamental operating frequency of the amplifier) between the RF transistor amplifier die and transmission lines connected thereto and (2) harmonic termination circuits that are designed to at least partly terminate harmonics that may be generated during device operation, such as second and third order harmonics. The RF transistor amplifier die(s) as well as the impedance matching and harmonic termination circuits may be enclosed in a package. Electrical leads may extend from the package to electrically connect the RF transistor amplifier to external circuit elements such as input and output RF transmission lines and bias voltage sources.

As noted above, Group Ill nitride-based RF transistor amplifiers are often used in high power and/or high frequency applications. Typically, high levels of heat are generated within a Group III nitride-based RF transistor amplifier die during operation. If the RF transistor amplifier die becomes too hot, its performance (e.g., output power, efficiency, linearity, gain, etc.) may deteriorate and/or the RF transistor amplifier die may be damaged. As such, Group Ill nitride-based RF transistor amplifiers are typically mounted in packages that may be optimized for heat removal.

SUMMARY

A method of packaging an RF transistor device according to some embodiments includes attaching one or more electronic devices including an RF transistor die to a carrier substrate, applying an encapsulant material over at least one of the one or more electronic devices, and providing a protective structure on the carrier substrate over the one or more electronic devices.

The encapsulant material may include a curable liquid encapsulant material, and the method may include dispensing the curable liquid encapsulant material over the RF transistor die. The encapsulant material may include a polytetrafluoroethylene (PTFE) based material. In some embodiments, the encapsulant material may include a liquid silicone, polyimide, benzocyclobutene and/or a liquid epoxy resin.

The protective structure may include a lid that forms a seal on the carrier substrate around the one or more electronic devices and the encapsulant material. In some embodiments, an open-cavity is present between the lid and the one or more electronic devices.

The method may further include providing an auxiliary electronic device on the carrier substrate and connecting the auxiliary electronic device to the RF transistor die prior to providing the encapsulant material over the RF transistor die.

The protective structure may include a plastic overmolding on the carrier substrate, and the plastic overmolding may contact the carrier substrate and covers the encapsulant and the one or more electronic devices. The plastic overmolding may contact the encapsulant material. The encapsulant material and the plastic overmolding may have different coefficients of thermal expansion. In some embodiments, the encapsulant material and the plastic overmolding may have different hardness.

Curing the curable encapsulant may include fully curing the curable encapsulant after providing the protective structure over the RF transistor die.

The method may further include providing an adhesive between the protective structure and the carrier substrate, and simultaneously curing the curable encapsulant and the adhesive.

Curing the curable encapsulant may include fully curing the curable encapsulant before providing the protective structure over the one or more electronic devices.

Attaching the one or more electronic devices to the carrier substrate may include attaching at least one of the one or more electronic devices to the carrier substrate with a sintered silver or eutectic die attach.

Attaching the one or more electronic devices to the carrier substrate may include forming solder bumps on the carrier substrate and/or the one or more electronic devices and attaching the one or more electronic devices to the carrier substrate via the solder bumps, wherein the curable encapsulant extends between the one or more electronic devices and the carrier substrate.

Curing the curable encapsulant may include exposing the curable encapsulant to light, heat, radiation or ultrasonic energy.

The curable encapsulant may include a curing agent in the curable encapsulant. Applying the curable encapsulant may include dispensing the curable encapsulant and the curing agent over the RF transistor die.

The method may further include forming an encapsulant dam on the carrier substrate around the at least one of the one or more electronic devices, wherein the encapsulant dam defines a die attach region of the carrier substrate, and wherein the encapsulant material is provided within the die attach region.

The RF transistor die may include a high electron mobility transistor, a field effect transistor or a monolithic microwave integrated circuit. The RF transistor die may include a GaN-based device or a SiC-based device. In some embodiments, the RF transistor die may have an operating frequency greater than 1 GHz.

A packaged RF transistor device includes a carrier substrate, one or more electronic devices attached to the carrier substrate, an encapsulant material over at least one of the one or more electronic devices and extending onto the carrier substrate, and a protective structure on the carrier substrate over the one or more electronic devices and the encapsulant material.

The encapsulant material may include a polytetrafluoroethylene (PTFE) based material.

The protective structure may include a lid that forms a seal on the carrier substrate around the one or more electronic devices and the curable encapsulant. An open-cavity may be present between the lid and the one or more electronic devices.

The packaged RF transistor device may further include an auxiliary electronic device on the carrier substrate adjacent the RF transistor device. The encapsulant material may cover the RF transistor device and the auxiliary electronic device.

The protective structure may include a plastic overmolding on the carrier substrate, wherein the plastic overmolding contacts the carrier substrate and covers the encapsulant material and the one or more electronic devices.

The one or more electronic devices may be attached to the carrier substrate with a sintered silver or eutectic die attach.

The encapsulant material may include silicone, polyimide, benzocyclobutene and/or epoxy resin.

The one or more electronic devices may be attached to the carrier substrate, and the encapsulant material may extend between the RF transistor die and the carrier substrate.

The encapsulant material may include an additive that modifies a dielectric constant of the encapsulant material.

The packaged RF transistor device may further include an encapsulant dam on the carrier substrate around the at least one of the one or more electronic devices, wherein the encapsulant dam defines a die attach region of the carrier substrate, and wherein the encapsulant material is provided within the die attach region.

BRIEF DESCRIPTION OF THE DRAWINGS

The accompanying drawings, which are included to provide a further understanding of the inventive concepts and are incorporated in and constitute a part of this application, illustrate certain embodiment(s) of the inventive concepts. In the drawings.

DETAILED DESCRIPTION

Figure 1A:
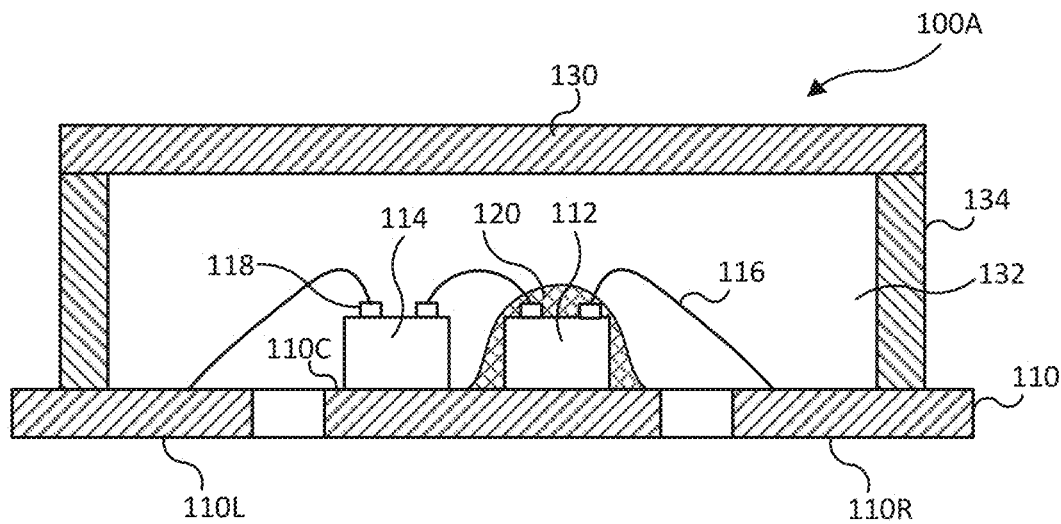
FIGS. 1A, 1B, 1C, 1D, 2A, 2B, 2C, 2D, 3A, 3B, 4A, 4B, 5A and 5B are schematic cross-sectional views of RF packages according to various embodiments.

Embodiments of the present inventive concepts now will be described more fully hereinafter with reference to the accompanying drawings, in which embodiments of the inventive concepts are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the inventive concepts belongs. It will be further understood that terms used herein should be interpreted as having a meaning that is consistent with their meaning in the context of this specification and the relevant art and will not be interpreted in an idealized or overly formal sense unless expressly so defined herein.

In open-cavity packages for RF power applications, one or more RF power transistor devices are mounted to a copper or ceramic (e.g., alumina) based flange. For example, standard RF transistor amplifier packages are often built with CPC (copper, copper-molybdenum, copper laminate), CuW or CuMo flanges.

The lid, which may be metal or ceramic, provides environmental protection to the RF die within an open-cavity defined by the lid, the submount and the sidewalls. Due to mismatched coefficients of thermal expansion between the lid and the flange and/or package leads, moisture may nevertheless enter the package, particularly when it is heat-cycled during device operation.

Some embodiments described herein provide an RF transistor amplifier package including a dispensed moisture barrier over an RF transistor die. The dispensed moisture barrier is formed by dispensing a curable encapsulant over the RF transistor die and subsequently curing the curable encapsulant. Providing a dispensed moisture barrier over the RF die may help protect the RF transistor die from moisture that may penetrate the interface between the lid and the flange of the package while maintaining RF performance characteristics of the RF die.

FIG. 1A is a schematic cross-sectional view of an RF transistor amplifier package 100A according to some embodiments. The package 100A includes a carrier substrate 110, such as a flange or lead frame, on which an RF power transistor die 112 is mounted. The carrier substrate 110 may include an electrically conductive material such as Cu, CPC (e.g., a copper/copper-molybdenum/copper laminate structure) or CuW, or an electrically insulating material such as a ceramic (e.g., alumina) having a high thermal conductivity.

The package 100A includes sidewalls 134 and a lid 130 that together with the carrier substrate define an open-cavity 132. The RF transistor die 112 (including its interconnect structure) is disposed on the carrier substrate 110 within the open-cavity 132.

The carrier substrate 110 may include materials configured to assist with the thermal management of the package 100A. For example, the carrier substrate 110 may include copper and/or molybdenum. In some embodiments, the carrier substrate 1130 may be composed of multiple layers and/or contain vias/interconnects. The sidewalls 134 and/or lid 130 may be formed of or include an insulating material in some embodiments. For example, the lid 130 may be formed of or include ceramic materials. In some embodiments, the lid 130 may be formed of, for example, $Al_2O_3$. The lid 130 may be glued to the sidewalls 134 using an epoxy glue. The sidewalls 134 may be attached to the carrier substrate 110 via, for example, CuAg brazing.

The RF transistor die 112 may be attached to the carrier substrate 110 in a die attach region 110C of the carrier substrate 110 using a solder, a eutectic die attach material such as AuSi or AuSn, or an organic adhesive. In some embodiments, the RF transistor die 112 may be attached to the carrier substrate 110 using a sintered silver die attach. In a sintered silver die attach process, silver paste is printed or dispensed onto the carrier substrate 110, and the RF transistor die 112 is placed on top of the silver paste. Pressure (e.g., in the range of several tens of MPa) and temperature (e.g. around 240° C.) are then applied to the RF transistor die 112 to cause sintering of the silver to form a strong adhesive connection between the RF transistor die 112 and the carrier substrate 110.

The RF transistor die 112 may be an RF electronic device, such as a high electron mobility transistor (HEMT), or a power MOSFET device, such as a lateral diffused MOSFET (LDMOS) formed in silicon, silicon carbide, gallium arsenide, gallium nitride, etc. In particular, the RF transistor die 112 may have an operational frequency greater than 1 GHZ, and in some embodiments greater than 5 GHZ, and in some embodiments greater than 20 GHz.

One or more auxiliary electronic devices 114 may be mounted onto the carrier substrate 110 along with the RF transistor die 112. The auxiliary electronic devices 114 may include, for example, input and/or output match capacitors, DC blocking capacitors, IPDs (integrated passive devices), etc., and may be used to form circuits, such as input matching circuits, interstage matching circuits, output matching circuits, harmonic reduction circuits (including baseband harmonics or fundamental frequency harmonics), bias voltage adjustment circuits, electrostatic discharge circuits, etc. In some embodiments, the auxiliary electronic devices 114 may include active devices, such as GaAs, Si and/or GaN transistors forming a first amplification stage.

Wirebonds 116 may be formed to bond pads 118 on the RF transistor die 112 and/or the auxiliary electronic devices 114 to connect the RF transistor die 112 and/or the auxiliary electronic devices 114 to each other and to conductive leads or traces on members 110L, 110R of the carrier substrate 110. In some embodiments, the RF transistor die 112 and/or the auxiliary electronic devices 114 may be connected to metal leads (not shown), that extend through or under the side walls 134.

The lid 130 is mounted on the carrier substrate 110 over the die attach region 110C of the carrier substrate 110. The lid 130 defines an open-cavity 132 over the RF transistor die 112 and the auxiliary electronic devices 114 mounted on the carrier substrate 110, and the lid 130 provides environmental protection for the RF transistor die 112 and the auxiliary electronic devices 114 within the open-cavity 132. In particular, the lid 130 may be non-hermetically sealed to the side walls 132 and/or carrier substrate 110 with an adhesive, such as a heat-activated glue or epoxy, to reduce/prevent moisture from undesirably entering the open-cavity 132 and damaging the RF transistor die 112, the auxiliary electronic devices 114, the wirebonds 116, and/or other components of the package 100A.

To provide additional protection to the RF transistor die as shown in FIG. 1A, an encapsulant material 120 may be provided over the RF transistor die 112 prior to mounting the lid 130 onto the carrier substrate 110. The encapsulant material 120 may be provided by dispensing a curable liquid encapsulant material over the RF transistor die 112 and subsequently curing the curable liquid encapsulant. The curable encapsulant may cover exposed surfaces of the RF transistor die 112, including a top surface of the die 112 and side surfaces of the die 112, and may extend onto an upper surface of the carrier substrate 110 adjacent the RF transistor die 112. As will be appreciated, an upper surface of an RF transistor die 112 may be coated during the die processing stage with a passivation material, such as polyimide. Such passivation does not extend onto side surfaces of the die, since dicing is performed after passivation. Moreover, the high temperatures (up to 315° C.) used during die attach can degrade the chip-level passivation. In contrast, an encapsulant material 120 may provide additional protection to the corners and side surfaces of the RF transistor die 112 after die attach.

In some embodiments, the curable encapsulant material 120 may include an amorphous polytetrafluoroethylene (PTFE) fluoropolymer. Examples of amorphous fluoropolymers that are commercially available include Teflon® AF from Dupont® and Cytop™ from Asahi Glass Co., Ltd., Tokyo, Japan. These materials can be applied as a thin coating in a fluorosolvent.

To encapsulate an RF transistor die 112 using amorphous PTFE fluoropolymers, a dilute solution (typically 5% by weight) of Teflon AF® in a mixture of C5-C18 perfluoro solvents may be applied using a dropper, manual syringe, automated syringe or other dispensing method, then allowed to dry. A series of such coatings can be applied to build up a sufficiently thick layer to provide a desired level of protection for the RF transistor die 112. The coatings may be cured at room temperature or at an elevated temperature (e.g., 50-70° C.) until the solvent has evaporated.

In some embodiments, air atomized spraying may be used to coat the RF transistor die 112 with PTFE. In this method a dispersion of low molecular weight solids of PTFE suspended in a suitable carrier liquid such as a solvent or water is atomized and sprayed onto the RF transistor die. The carrier is then evaporated, leaving a coating of PTFE. The coating may be sintered to increase its uniformity. Typical film thicknesses are from 10 to 100 microns thick, for example from 20 to 50 microns thick. The PTFE particles in the dispersion may have an average particle size of less than 100 microns, and in some cases less than 50 microns. Even further, the PTFE particles may have an average particle size less than 30 microns. In still further embodiments, the PTFE particles may comprise nanoparticles having an average particle size of less than 400 nm. For example, in some embodiments, the PTFE particles may have an average particle size from 350 nm to 400 nm, in some embodiments an average particle size from 100 to 150 nm, and in some embodiments an average particle size from 30 to 50 nm.

In conventional or air atomized spraying, the coating is supplied to a spray gun by siphon, gravity, or pressure feed. When the gun trigger is pulled, the coating flows through the nozzle as a fluid stream. Compressed air from the center of the nozzle surrounds the fluid with a hollow cone as it leaves the nozzle, breaking the coating into small droplets and transferring velocity to the droplets and driving them toward the RF transistor die.

The atomized spray may be applied using electrostatic or non-electrostatic coating. In electrostatic coating, the fluid is atomized, then negatively charged. The part to be coated is electrically neutral, making the part positive with respect to the negative coating droplets. The coating particles are attracted to the surface and held there by the charge differential until cured.

The dispersing solvent may be sufficiently volatile to evaporate quickly, leaving the PTFE particles in a substantially dry state. A suitable dispersing solvent is trichlorotrifluoroethane, although other low-boiling halogenated hydrocarbons can also be used. The dispersion may be subjected to energy in the form of light, heat, radiation or ultrasonic energy to further cure the encapsulant.

PTFE may be a good choice for encapsulating an RF transistor die due to its relatively low dielectric constant, low permittivity and high dielectric strength. For example, extruded PTFE has a dielectric constant of about 2, and is commonly used as an insulator in coaxial cables for RF signal transmission. For comparison, materials commonly used for plastic overmolding of RF components, such as KMC-2110G-7 manufactured by Shin Etsu Handotai and G700H manufactured by Sumitomo Electric Corporation have a dielectric constant of around 2.6-4.5. Moreover, PTFE generally has a high resistance to chemical attack and low surface free energy leading to its hydrophobic nature, both of which are qualities that increase its effectiveness as a protective coating.

In other embodiments, the curable encapsulant material 120 may include a curable epoxy resin, polyimide, benzocyclobutene (BCB), or a curable liquid silicone, which may be dispensed in liquid form onto the carrier substrate 110 over the RF transistor die 112.

The curable encapsulant material 120 is cured to cause it to harden and solidify over/around the RF transistor die 112. Curing may be accomplished by exposing the curable encapsulant material 120 to energy, such as light, heat, radiation or ultrasonic energy for a sufficient time to harden the encapsulant material by, for example, evaporating a solvent in the curable encapsulant material. As will be appreciated, the curing process may involve cross-linking of polymers within the encapsulant material. Such cross-linking imparts mechanical strength and stability to the cured encapsulant, which increases the protection of the RF transistor die 112.

In particular, PTFE has been found to be cross-linkable to form a network structure when subjected to high energy radiation, such as by irradiating the material at a temperature of 330-340° C. in a vacuum. Cross-linked PTFE has been found to gain a great improvement in both high temperature mechanical properties and radiation stability.

In some embodiments, the curable encapsulant material 120 may be at least partially cured before the lid 130 is attached to the carrier substrate 110. When the curable encapsulant material 120 is not cured or only partially cured prior to attachment of lid 130, the curing of the curable encapsulant material 120 may be completed after the lid 130 is attached to the carrier substrate 110. In some embodiments, the curable encapsulant material 120 may be cured at the same time as a heat-activated adhesive used to attach the lid 130 to the carrier substrate 110 is cured, such as by way of heat treatment. In some embodiments, the curable encapsulant material 120 may be partially cured prior to attachment of the lid 130 so as to cause a solvent in the curable encapsulant material 120 to evaporate prior to attachment of the lid 130, and the curable encapsulant material 120 may be fully cured after attachment of the lid 130, such as to cause cross-linking of polymers within the curable encapsulant material 120. That is, curing after attachment of the lid 130 may involve cross-linking within the encapsulant material 120 rather than outgassing of evaporated solvent from the encapsulant material 120.

In some embodiments, a curing agent or additive such as a hardener or drying agent may be added to the curable encapsulant material 120 to enhance or speed up the curing process. In some embodiments, a dielectric modulating additive, such as metal flakes or powder, may be added to the curable encapsulant material 120 to modify the dielectric constant of the encapsulant.

Although a single RF transistor die 112 is illustrated in FIG. 1A, it will be appreciated that the RF transistor amplifier package 100A may include more than one RF transistor die 112, and that the encapsulant material 120 may cover one or more, or not cover one or more, of the RF transistor dies 112 and/or the auxiliary electronic devices 114.

Figure 1B:
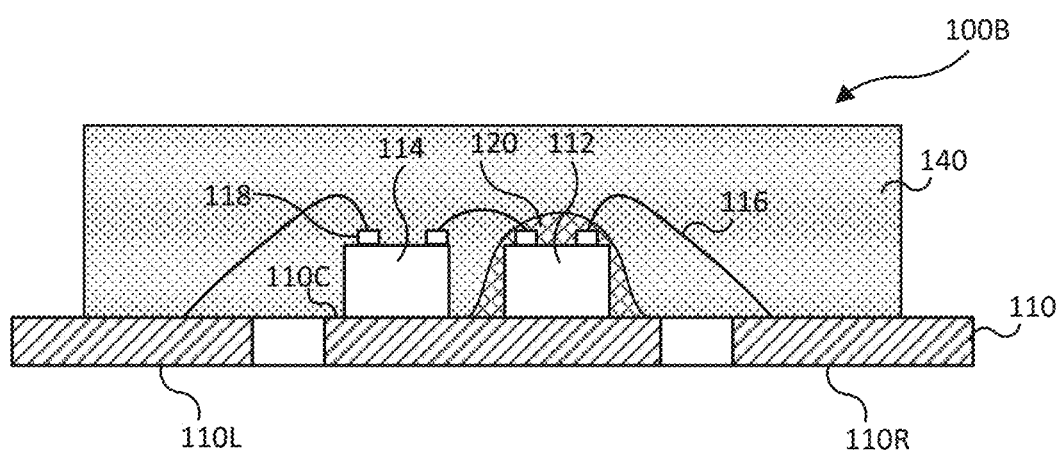

FIG. 1B illustrates an RF transistor amplifier package 100B according to further embodiments. The structure of the RF transistor amplifier package 100B is similar to that of RF transistor amplifier package 100A shown in FIG. 1A (with like numbers referring to like elements), except that instead of having a lid over the RF transistor die 112 and the auxiliary electronic device 114, a protective plastic overmold 140 is formed on the carrier substrate 110 over the RF transistor die 112 and the auxiliary electronic device 114. The plastic overmold 140 may be formed, for example, by inserting the carrier substrate 110 on which the RF transistor die 112 and the auxiliary electronic device 114 are mounted into a mold and then injection molding plastic over the RF transistor die 112 and the auxiliary electronic device 114 to form the plastic overmold 140. The curable encapsulant material 120 is provided on the RF transistor die 112 prior to injection molding and at least partially cured prior to injection molding, so that the plastic overmold 140 is formed directly on the cured/curable encapsulant material 120. In some embodiments, the cured/curable encapsulant material 120 may be fully cured prior to formation of the plastic overmold 140.

The overmold material 140, which may be a plastic or a plastic polymer compound, is injection molded around RF transistor die 112, thereby providing protection from the outside environment.

The carrier substrate 110 of package 100B may include materials configured to assist with thermal management. For example, the carrier substrate 110 may include copper and/or molybdenum. In some embodiments, the carrier substrate 110 may be composed of multiple layers and/or contain vias/interconnects. In some embodiments, the carrier substrate 110 may include a metal heat sink that is part of a lead frame or metal slug that is at least partially surrounded by a plastic overmold 140.

Accordingly, in the RF transistor amplifier package 100B, there may be no air gap above the RF transistor die 112 and the cured/curable encapsulant material 120. Moreover, the cured/curable encapsulant material 120 may provide additional mechanical stability and protection to the wirebonds 116 during formation of the protective plastic overmold 140.

Although a single RF transistor die 112 and auxiliary electronic device 114 are illustrated in FIG. 1B, it will be appreciated that the RF transistor amplifier package 100B may include more than one RF transistor die 112 and/or more than one auxiliary electronic device 114, and that the encapsulant material 120 may cover one or more, or not cover one or more, of the RF transistor dies and/or the auxiliary electronic devices 114.

Figure 1C:
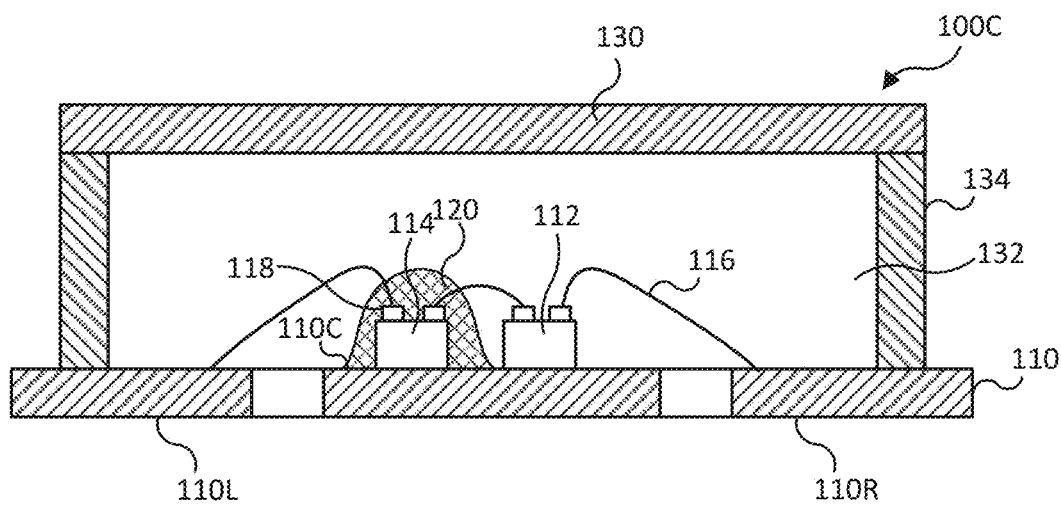

FIG. 1C illustrates an RF transistor amplifier package 100C according to further embodiments. The structure of the RF transistor amplifier package 100C is similar to that of RF transistor amplifier package 100A shown in FIG. 1A (with like numbers referring to like elements), except that the encapsulant material 120 is formed over one or more of the auxiliary electronic devices 114 and not over one or more of the RF transistor die 112.

Figure 1D:
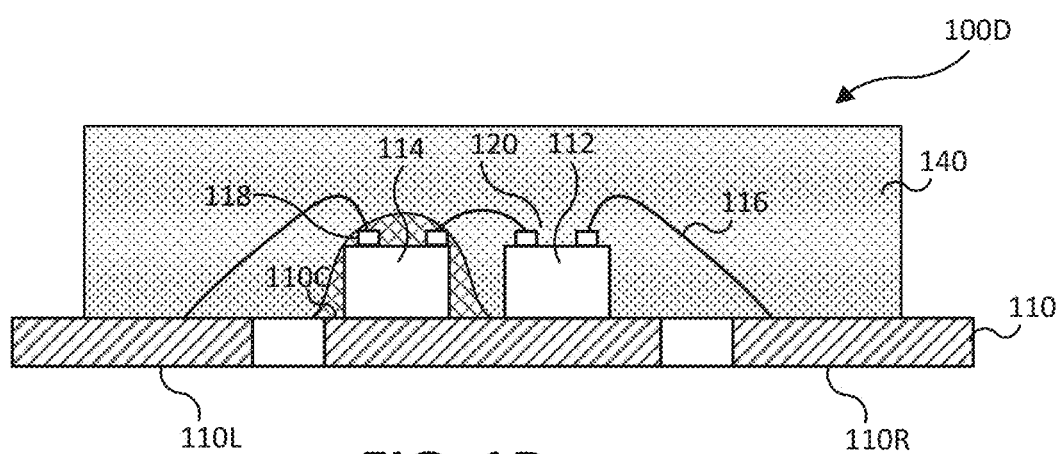

FIG. 1D illustrates an RF transistor amplifier package 100D according to further embodiments. The structure of the RF transistor amplifier package 100D is similar to that of RF transistor amplifier package 100B shown in FIG. 1B (with like numbers referring to like elements), except that the encapsulant material 120 is formed over one or more of the auxiliary electronic devices 114 and not over one or more of the RF transistor die 112.

Figure 2A:
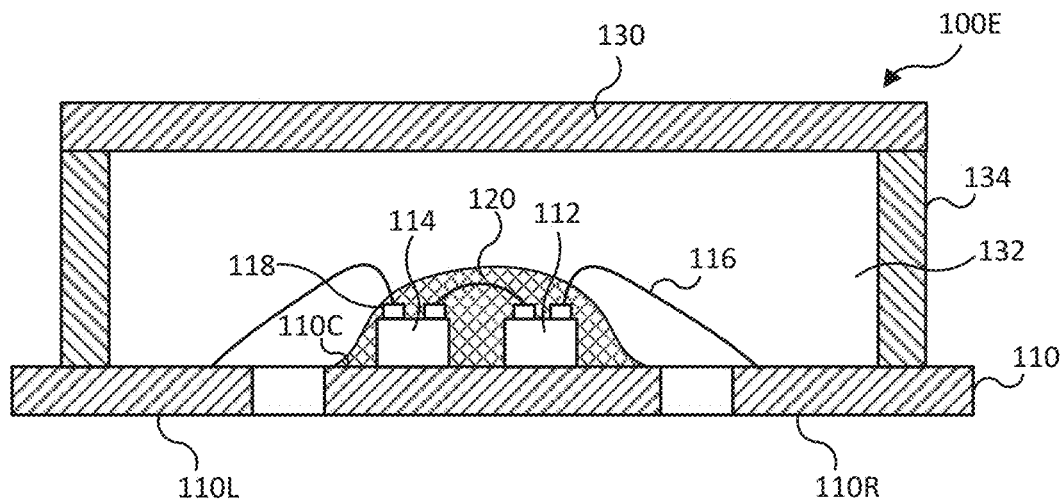

FIG. 2A illustrates an RF transistor amplifier package 100E according to further embodiments. The structure of the RF transistor amplifier package 100E is similar to that of RF transistor amplifier package 100A shown in FIG. 1A (with like numbers referring to like elements), except that in the RF transistor amplifier package 100E, the curable encapsulant material 120 covers both the RF transistor die 112 and the auxiliary electronic device 114.

Although a single RF transistor die 112 and auxiliary electronic device 114 are illustrated in FIG. 2A, it will be appreciated that the RF transistor amplifier package 100E may include more than one RF transistor die 112 and/or more than one auxiliary electronic device 114, and that the encapsulant material 120 could cover some, all or none of the RF transistor dies 112 and/or the auxiliary electronic devices 114 in various embodiments.

Figure 2B:
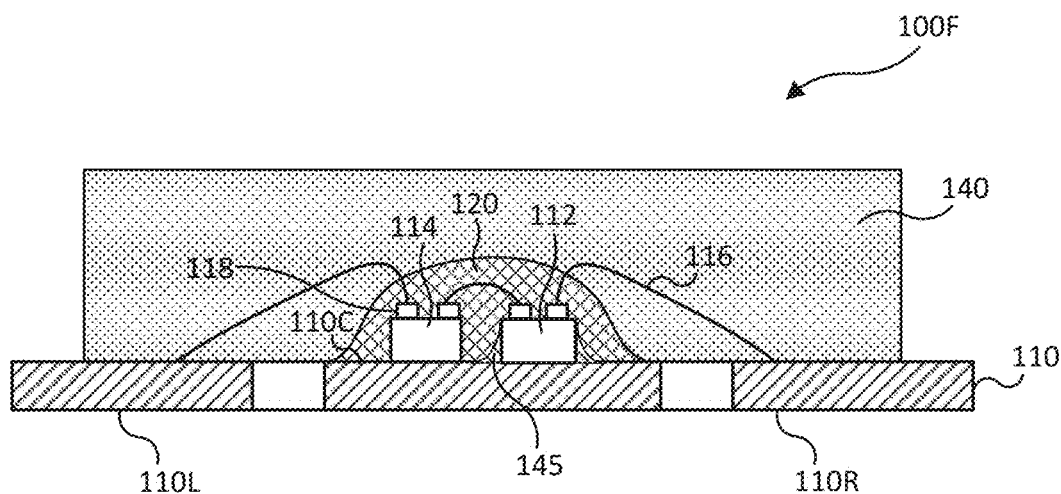

FIG. 2B illustrates an RF transistor amplifier package 100F according to further embodiments. The structure of the RF transistor amplifier package 100F is similar to that of RF transistor amplifier package 100A shown in FIG. 1A (with like numbers referring to like elements), except that in the RF transistor amplifier package 100F, the curable encapsulant material 120 covers both the RF transistor die 112 and the auxiliary electronic device 114, and instead of having a lid over the RF transistor die 112 and the auxiliary electronic device 114, a protective plastic overmold 140 is formed on the carrier substrate 110 over the RF transistor die 112 and the auxiliary electronic device 114. Moreover, FIG. 2B also illustrates attachment of the RF transistor die 112 to the carrier substrate 110 using a sintered silver die attach 145. It will be appreciated that, although a sintered silver die attach 145 is illustrated only in the embodiment of FIG. 2B, such a die attach could be used in any of the illustrated embodiments.

The addition of the curable encapsulant material 120 over the RF transistor die 112 may provide additional protection to the sintered silver die attach 145. In particular, sintered silver may be susceptible to the formation of dendrites, which are branches or extensions of the silver, when exposed to moisture. Dendrite growth can lead to short circuits and device failure. The curable encapsulant material 120 may provide additional moisture protection to the sintered silver die attach 145 that may inhibit or retard the growth of dendrites from the sintered silver die attach 145, which may prolong the life of the device.

Although a single RF transistor die 112 and auxiliary electronic device 114 are illustrated in FIG. 2B, it will be appreciated that the RF transistor amplifier package 100F may include more than one RF transistor die 112 and/or more than one auxiliary electronic device 114, and that the encapsulant material 120 could cover some, all or none of the RF transistor dies 112 and/or the auxiliary electronic devices 114 in various embodiments.

Figure 2C:
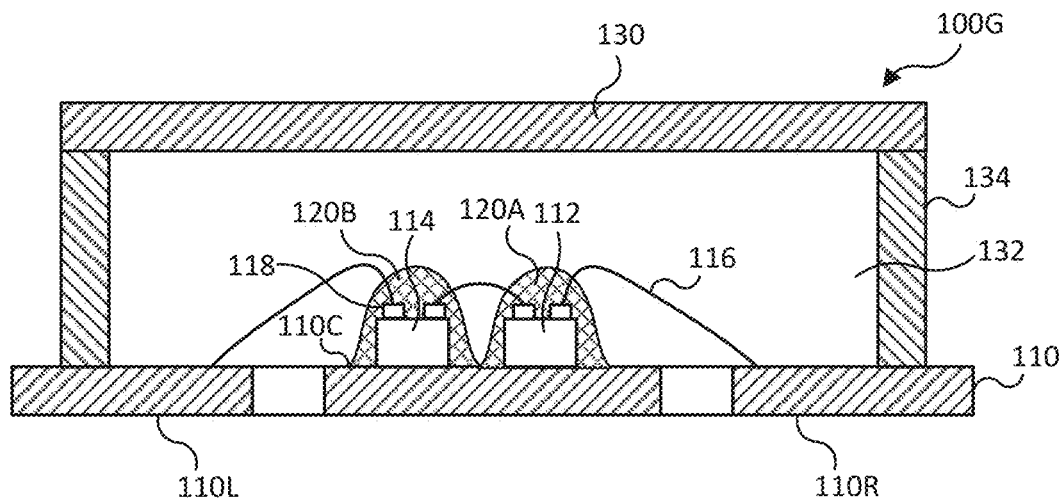

FIG. 2C illustrates an RF transistor amplifier package 100G according to further embodiments. The structure of the RF transistor amplifier package 100G is similar to that of RF transistor amplifier package 100E shown in FIG. 2A (with like numbers referring to like elements), except that in the package 100G, separate encapsulants 120A, 120B are provided over one or more of the RF transistor dies 112 and the auxiliary electronic devices 114.

Although a single RF transistor die 112 and auxiliary electronic device 114 are illustrated in FIG. 2C, it will be appreciated that the RF transistor amplifier package 100G may include more than one RF transistor die 112 and/or more than one auxiliary electronic device 114, and that the encapsulants 120A, 120B could cover some, all or none of the RF transistor dies 112 and/or the auxiliary electronic devices 114 in various embodiments.

Figure 2D:
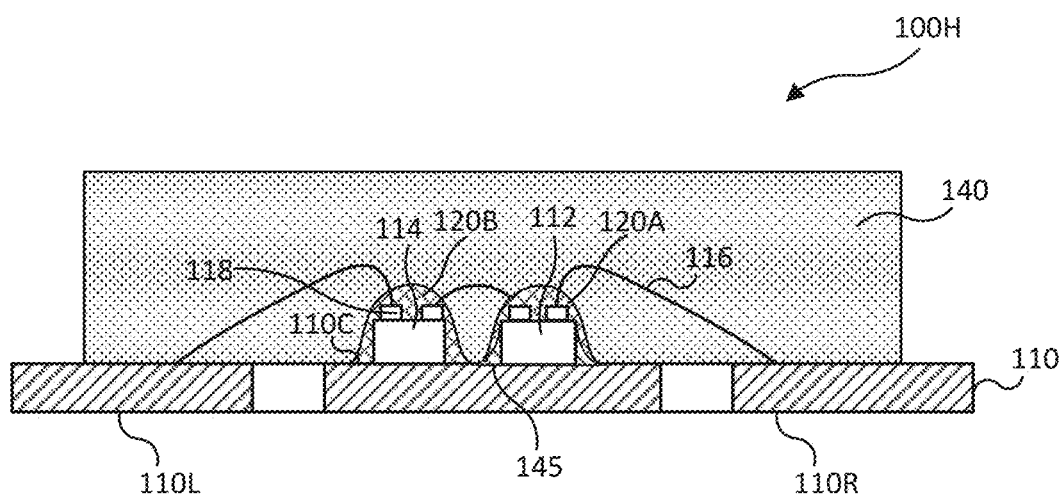

FIG. 2D illustrates an RF transistor amplifier package 100H according to further embodiments. The structure of the RF transistor amplifier package 100H is similar to that of RF transistor amplifier package 100F shown in FIG. 2B (with like numbers referring to like elements), except that in the package 100H, separate encapsulants 120A, 120B are provided over one or more of the RF transistor dies 112 and the auxiliary electronic devices 114.

Although a single RF transistor die 112 and auxiliary electronic device 114 are illustrated in FIG. 2D, it will be appreciated that the RF transistor amplifier package 100H may include more than one RF transistor die 112 and/or more than one auxiliary electronic device 114, and that the encapsulants 120A, 120B could cover some, all or none of the RF transistor dies 112 and/or the auxiliary electronic devices 114 in various embodiments.

Figure 3A:
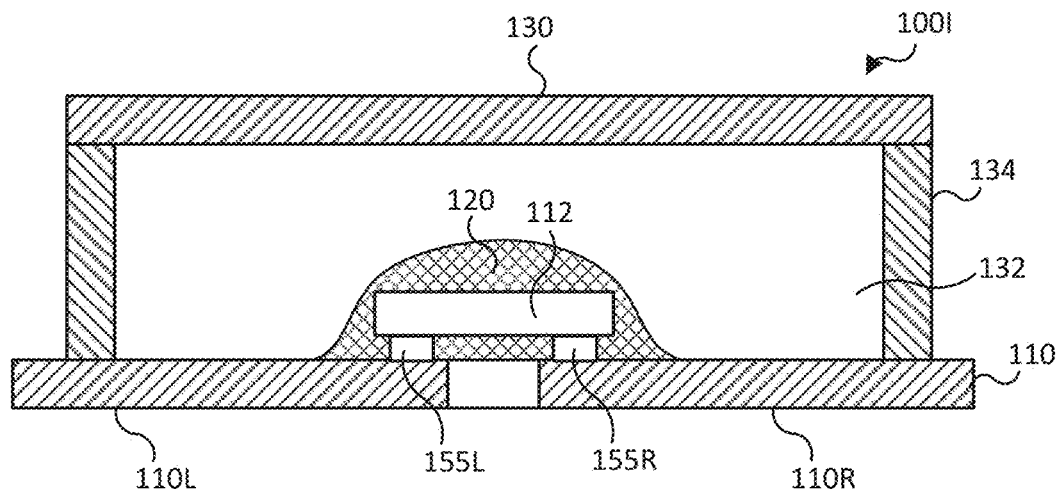

FIG. 3A illustrates an RF transistor amplifier package 100I according to further embodiments. The structure of the RF transistor amplifier package 100I is similar to that of RF transistor amplifier package 100A shown in FIG. 1A (with like numbers referring to like elements), except that in the RF transistor amplifier package 100I, the RF transistor die 112 is flip-mounted onto the carrier substrate 110 through solder bumps 155L, 155R formed on the RF transistor die 112 and/or the carrier substrate 110, thus obviating the need to provide wirebond connections between the RF transistor die 112 and the carrier substrate 110 or traces/leads on the carrier substrate 110. As illustrated in FIG. 3A, the curable encapsulant material 120 may flow under the RF transistor die 112 between the RF transistor die 112 and the carrier substrate 110 to protect the underside of the flip-mounted RF transistor die 112.

Although an auxiliary electronic device is not illustrated in FIG. 3A, it will be appreciated that one or more auxiliary electronic devices may be included within the package 100I. Moreover, although a single RF transistor die 112 is illustrated in FIG. 3A, it will be appreciated that the RF transistor amplifier package 100I may include more than one RF transistor die 112, and that the encapsulant material 120 could cover some, all or none of the RF transistor dies 112 and/or the auxiliary electronic devices 114 in various embodiments.

Figure 3B:
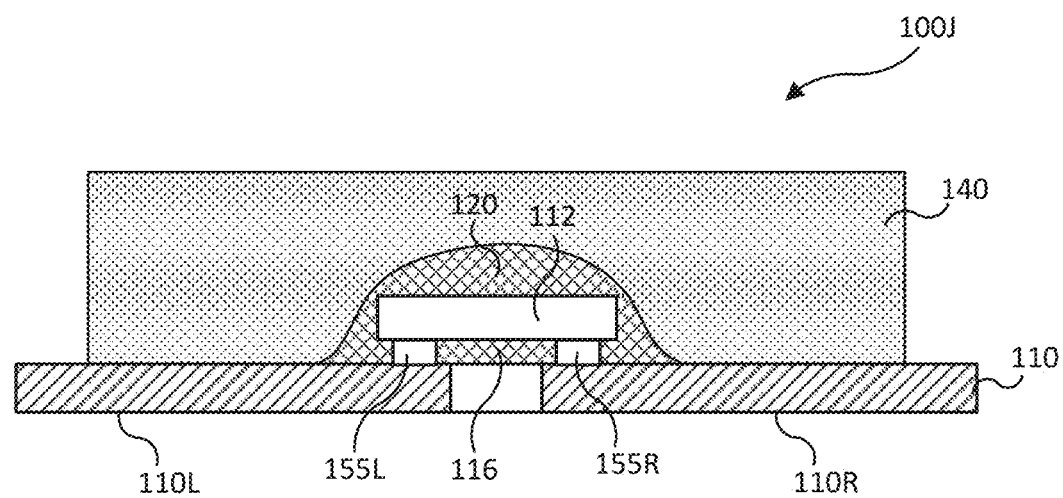

FIG. 3B illustrates an RF transistor amplifier package 100J according to further embodiments. The structure of the RF transistor amplifier package 100J is similar to that of RF transistor amplifier package 100I shown in FIG. 3A (with like numbers referring to like elements), except that in the RF transistor amplifier package 100J, instead of having a lid over the RF transistor die 112, a protective plastic overmold 140 is formed on the carrier substrate 110 over the RF transistor die 112 and in direct contact with the curable encapsulant material 120 such that no open-cavity is formed above the RF transistor die 112.

As illustrated in FIG. 3B, the curable encapsulant material 120 may flow under the RF transistor die 112 in the space 116 between the RF transistor die 112 and the carrier substrate 110 to protect the underside of the flip-mounted RF transistor die 112. This may prevent the material of the plastic overmold 140 from entering the space 116 between the RF transistor die 112 and the carrier substrate 110. If the material of the plastic overmold 140 were to enter the space 116, then, due to differences in coefficient of thermal expansion (CTE) between the plastic and the solder bumps 155L, 155R, expansion of the plastic could cause the RF transistor die 112 to detach from the carrier substrate 110, leading to device failure. Accordingly, some embodiments may provide a softer filler material that protects the underside of the RF transistor die 112 from the plastic overmold 140.

It will be appreciated that the curable encapsulant material 120 may be a material that is capable of withstanding the high operating temperatures of RF transistor devices. For example, the junction temperature ($T_J$) of a typical RF transistor device is about 225-275° C. A eutectic die attach is typically performed at about 315° C., while sintered silver typically requires heating at about 250-260° C. However, once attached and subjected to a 3 hour reflow cycle, the sintered silver can withstand higher temperatures, such as the expected operating junction temperature of the RF transistor device. A cross-linked PTFE encapsulant may be able to withstand the expected operating junction temperature of the RF transistor device.

Although an auxiliary electronic device is not illustrated in FIG. 3B, it will be appreciated that one or more auxiliary electronic devices may be included within the package 100J. Moreover, although a single RF transistor die 112 is illustrated in FIG. 3B, it will be appreciated that the RF transistor amplifier package 100J may include more than one RF transistor die 112, and that the encapsulant material 120 could cover some, all or none of the RF transistor dies 112 and/or the auxiliary electronic devices 114 in various embodiments.

Figure 4A:
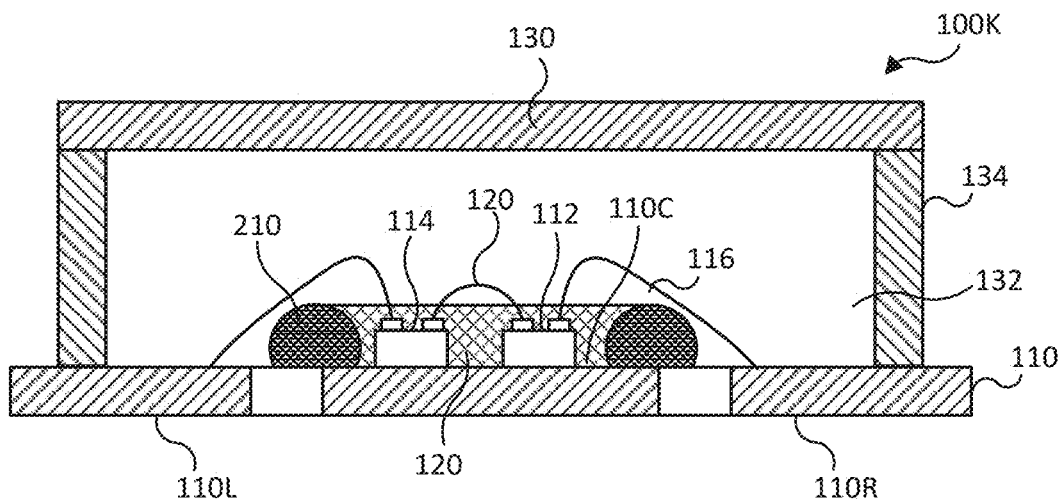

FIG. 4A illustrates an RF transistor amplifier package 100K according to further embodiments. In the RF transistor amplifier package 100K, the encapsulant material 120 is provided within a die attach region 110C defined by an encapsulant dam 210, which may comprise an encapsulant material, such as silicone, that is dispensed onto the carrier substrate 110. After the transistor die 112 and the auxiliary electronic device 114 are mounted on the carrier substrate 110 within the die attach region 110C, the encapsulant dam 210 may be dispensed onto the carrier substrate 110 and then at least partially cured prior to dispensing the encapsulant material 120 onto the carrier substrate 110 over the RF transistor die 112 and the auxiliary electronic device 114.

The inclusion of an encapsulant dam may provide more precise control over the position and/or thickness of the encapsulant material 120. For example, depending on the viscosity of the encapsulant material 120 and the clearances on the edges, the encapsulant dam 210 may help to deter or prevent the encapsulant 110 from interfering with the attaching of the lid 130 to the carrier substrate 110.

Although a single RF transistor die 112 and auxiliary electronic device 114 are illustrated in FIG. 4A, it will be appreciated that the RF transistor amplifier package 100K may include more than one RF transistor die 112 and/or more than one auxiliary electronic device 114, and that the encapsulant material 120 could cover some, all or none of the RF transistor dies 112 and/or the auxiliary electronic devices 114 in various embodiments.

Figure 4B:
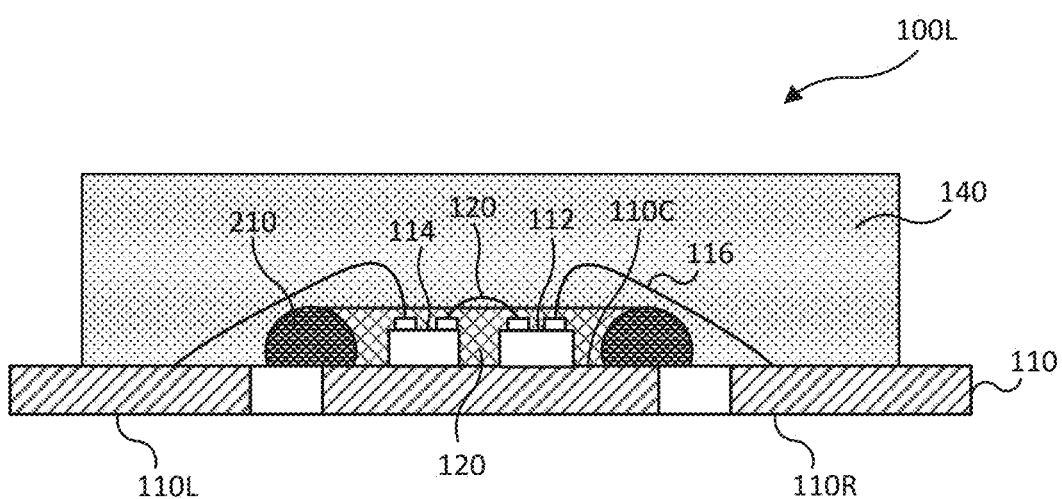

FIG. 4B illustrates an RF transistor amplifier package 100L according to further embodiments. The structure of the RF transistor amplifier package 100L is similar to that of RF transistor amplifier package 100K shown in FIG. 4A (with like numbers referring to like elements), except that in the RF transistor amplifier package 100L, instead of having a lid over the RF transistor die 112, a protective plastic overmold 140 is formed on the carrier substrate 110 over the RF transistor die 112 and in direct contact with the encapsulant dam 210 and encapsulant material 120 such that no open-cavity is formed above the RF transistor die 112.

Although a single RF transistor die 112 and auxiliary electronic device 114 are illustrated in FIG. 4B, it will be appreciated that the RF transistor amplifier package 100L may include more than one RF transistor die 112 and/or more than one auxiliary electronic device 114, and that the encapsulant material 120 could cover some, all or none of the RF transistor dies 112 and/or the auxiliary electronic devices 114 in various embodiments.

Figure 5A:
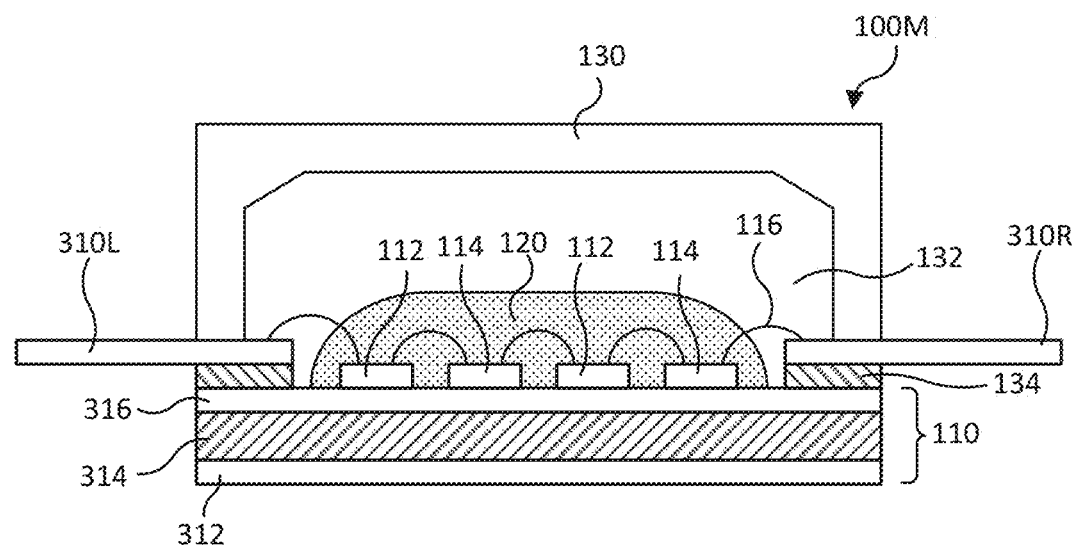

FIG. 5A is a schematic cross-sectional view of a thermally enhanced RF transistor amplifier package 100M according to further embodiments.

The package 100M includes a carrier substrate 110 on which one or more RF power transistor dies 112 and/or auxiliary electronic devices 114 are mounted. The carrier substrate 110 includes a conductive laminate structure of CPC including a layer of copper 312, a layer of copper molybdenum 314 and a layer of copper 316.

The package 100M includes sidewalls 134 and a lid 130 that together with the carrier substrate 110 define an open-cavity 132 above the RF power transistor dies 112 and/or auxiliary electronic devices 114. The sidewalls 134 and lid 130 may be formed of a ceramic material, such as $Al_2O_3$. The sidewall 134 may be attached to the carrier substrate 110 by CuAg brazing. The lid 130 may be glued to the sidewalls 134 using an epoxy glue.

Wirebonds 116 may be formed to the RF transistor die 112 and/or the auxiliary electronic devices 114 to connect the RF transistor die 112 and/or the auxiliary electronic devices 114 to each other and to conductive leads 310L, 310R that extend into the open-cavity 132. The conductive leads 310L, 310R may be attached to the sidewalls 132 by CuAg brazing.

An encapsulant material 120 is provided over the RF transistor dies 112 and auxiliary electronic devices 114 prior to mounting the lid 130 onto the carrier substrate 110. The encapsulant material 120 may be a curable liquid encapsulant material that is dispensed over the RF transistor dies 112 and auxiliary electronic devices 114 and subsequently cured. The encapsulant material 120 may cover exposed surfaces of the RF transistor dies 112, including top surfaces and side surfaces of the dies 112, and may extend onto an upper surface of the carrier substrate 110 adjacent the RF transistor dies 112.

Figure 7A:
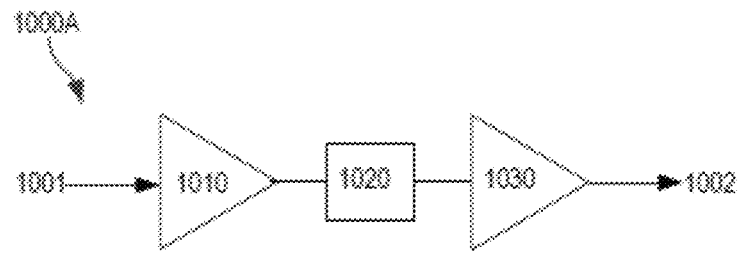
FIGS. 7A-7C are schematic block diagrams of multi-amplifier circuits in which the RF transistor amplifiers according to embodiments may be used.
Figure 7B:
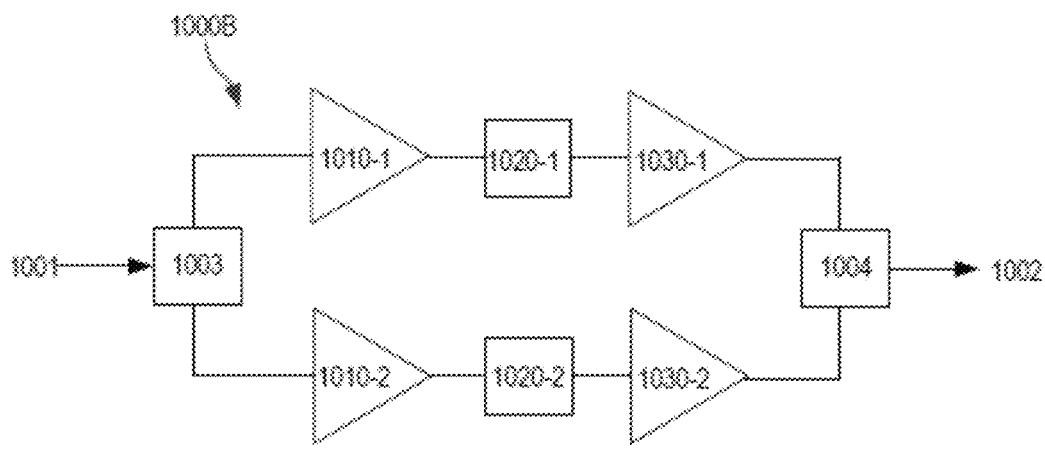
Figure 7C:
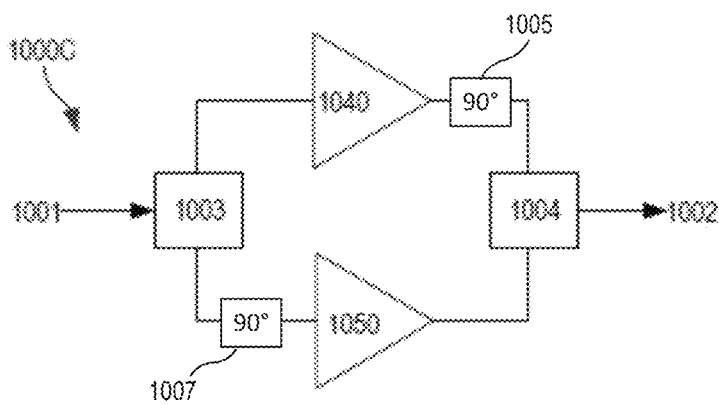

Depending on the embodiment, the RF transistor dies 112 and auxiliary electronic devices 114 could include single or multiple transistors along with input matching circuitry, output matching circuitry, baseband and/or fundamental frequency harmonic reduction circuitry, filters, biasing circuitry, electrostatic discharge (ESD), bias adjustment, filtering, interstage matching circuitry between serially connected transistors and/or other circuitry and components. Some embodiments include a single discrete transistor as well as multiple transistors in single and/or multiple paths, such as in a Doherty configuration, such as illustrated in FIGS. 7A-7C as discussed below. The encapsulant material 120 according to different embodiments can cover all, some or only a single one of the components. The encapsulant material 120 can be a single continuous encapsulant or multiple discrete encapsulations over some or all of the components described above, as well as other components of the package.

Figure 5B:
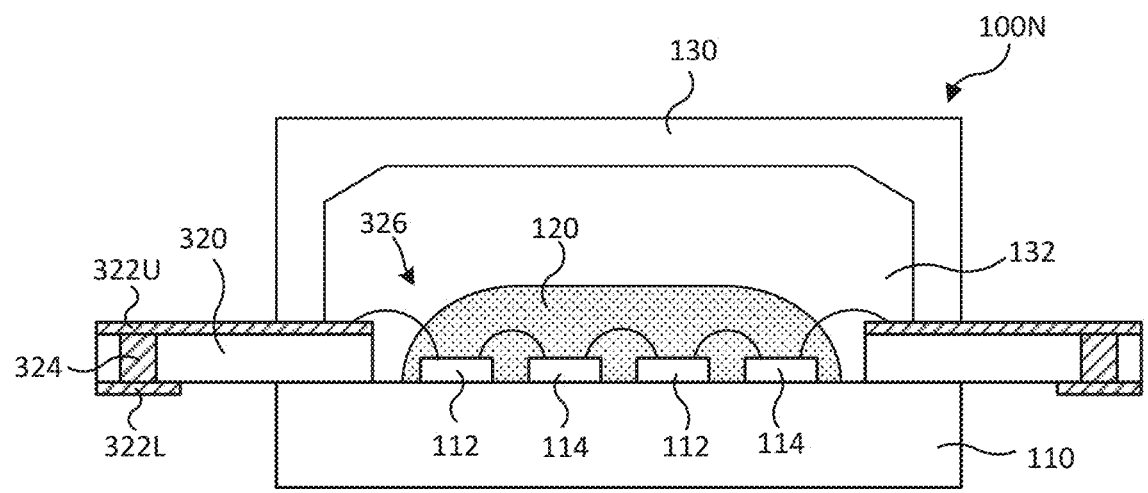

FIG. 5B is a schematic cross-sectional view of a thermally enhanced RF transistor amplifier package 100N according to further embodiments. The RF transistor amplifier package 100N is similar to the RF transistor amplifier package 100M discussed above with reference to FIG. 5A, except that the leads 310L, 310R are replaced with a printed circuit board (PCB) 320 that includes upper traces 322 that are wire-bonded to the RF transistor dies 112 and/or auxiliary electronic devices 114 to act as the input and output leads of the package 100M. The carrier substrate 110 may be a copper slug that acts as a heat sink for the package 100M. The printed circuit board 320 may be attached to the carrier substrate 110 via, for example, a conductive glue. The printed circuit board 320 includes a central opening 326 in which the RF transistor dies 112 and/or auxiliary electronic devices 114 are mounted on the carrier substrate.

Figure 6:
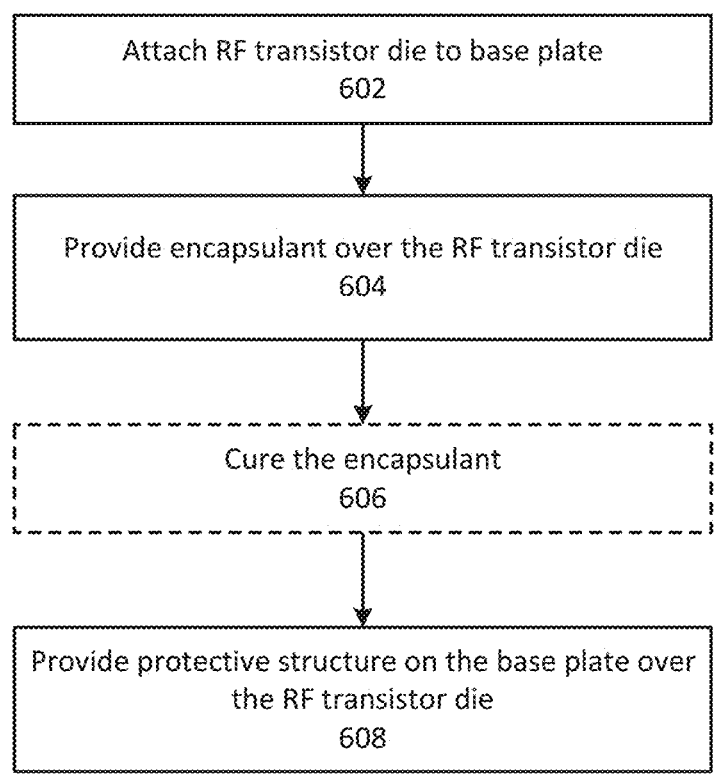
FIG. 6 is a flowchart of operations according to some embodiments.

FIG. 6 illustrates operations of forming a packaged RF transistor device according to some embodiments. Referring to FIG. 6, a method of forming a packaged RF transistor device according to some embodiments includes attaching an RF transistor die to a carrier substrate (block 602), and providing an encapsulant over the RF transistor die (block 604). Optionally, the operations may include at least partially curing the curable encapsulant (block 606). Finally, a protective structure (e.g., a lid) is provided on the carrier substrate over the RF transistor die (block 608).

The encapsulant may include a curable liquid encapsulant. In particular, the encapsulant may include a polytetrafluoroethylene (PTFE) based material. In some embodiments, the curable encapsulant may include a liquid silicone, polyimide, benzocyclobutene and/or a liquid epoxy resin.

The protective structure may include a lid that forms a seal on the carrier substrate around the RF transistor die and the curable encapsulant. In some embodiments, an open-cavity is present between the lid and the RF transistor die.

The method may further include providing an auxiliary electronic device on the carrier substrate and connecting the auxiliary electronic device to the RF transistor die prior to providing the curable encapsulant over the RF transistor die.

The protective structure may include a plastic overmolding on the carrier substrate, and the plastic overmolding may contact the carrier substrate and covers the curable encapsulant and the RF transistor die. The plastic overmolding may contact the encapsulant material. The encapsulant material and the plastic overmolding may have different coefficients of thermal expansion. In some embodiments, the encapsulant material and the plastic overmolding may have different hardness.

Curing the curable encapsulant may include fully curing the curable encapsulant after providing the protective structure over the RF transistor die.

The method may further include providing an adhesive between the protective structure and the carrier substrate, and simultaneously curing the curable encapsulant and the adhesive.

Curing the curable encapsulant may include fully curing the curable encapsulant before providing the protective structure over the RF transistor die.

Attaching the RF transistor die to the carrier substrate may include attaching the RF transistor die to the carrier substrate with sintered silver.

Attaching the RF transistor die to the carrier substrate may include forming solder bumps on the RF transistor die and/or the carrier substrate and attaching the RF transistor die to the carrier substrate via the solder bumps, wherein the curable encapsulant extends between the RF transistor die and the carrier substrate.

Curing the curable encapsulant may include exposing the curable encapsulant to light, heat, radiation or ultrasonic energy.

The curable encapsulant may include a curing agent in the curable encapsulant. Applying the curable encapsulant may include dispensing or spraying the curable encapsulant and the curing agent over the RF transistor die.

The RF transistor amplifiers described herein may be designed to operate in a wide variety of different frequency bands. In some embodiments, the RF transistor amplifiers may be configured to operate at frequencies greater than 1 GHz. In other embodiments, these RF transistor amplifier dies may be configured to operate at frequencies greater than 2.5 GHZ. In still other embodiments, the RF transistor amplifier dies may be configured to operate at frequencies greater than 3.1 GHZ. In yet additional embodiments, these RF transistor amplifier dies may be configured to operate at frequencies greater than 5 GHZ. In some embodiments, these RF transistor amplifier dies may be configured to operate in at least one of the 2.5-2.7 GHZ, 3.4-4.2 GHZ, 5.1-5.8 GHZ, 12-18 GHZ, 18-27 GHZ, 27-40 GHz or 40-75 GHz frequency bands or sub-portions thereof.

Although embodiments of the inventive concepts have been discussed above with respect to a RF transistor amplifier dies that are implemented using HEMT devices, it will be understood that other types of semiconductor devices may be formed in the semiconductor layer structure 230 without deviating from the present inventive concepts. For example, the semiconductor layer structure 230 may include a MOSFET, a DMOS transistor, a MESFET, and/or an LDMOS transistor in other embodiments.

The RF transistor amplifiers described above can be used as standalone RF transistor amplifiers. They may also be used in various applications that include multiple RF transistor amplifiers. Examples of how the RF transistor amplifiers according to embodiments may be used in applications that include multiple amplifiers will be discussed with reference to FIGS. 7A-7C.

Referring to FIG. 7A, an RF transistor amplifier 1000A is schematically illustrated that includes a pre-amplifier 1010 and a main amplifier 1030 that are electrically connected in series. As shown in FIG. 7A, RF transistor amplifier 1000A includes an RF input 1001, the pre-amplifier 1010, an inter-stage impedance matching network 1020, the main amplifier 1030, and an RF output 1002. The inter-stage impedance matching network 1020 may include, for example, inductors and/or capacitors arranged in any appropriate configuration in order to form a circuit that improves the impedance match between the output of pre-amplifier 1010 and the input of main amplifier 1030. While not shown in FIG. 7A, RF transistor amplifier 1000A may further include an input matching network that is interposed between RF input 1001 and pre-amplifier 1010, and/or an output matching network that is interposed between the main amplifier 1030 and the RF output 1002. The RF transistor amplifiers according to embodiments may be used to implement either or both of the pre-amplifier 1010 and the main amplifier 1030.

Referring to FIG. 7B, an RF transistor amplifier 1000B is schematically illustrated that includes an RF input 1001, a pair of pre-amplifiers 1010-1, 1010-2, a pair of inter-stage impedance matching networks 1020-1, 1020-2, a pair of main amplifiers 1030-1, 1030-2, and an RF output 1002. A splitter 1003 and a combiner 1004 are also provided. Pre-amplifier 1010-1 and main amplifier 1030-1 (which are electrically connected in series) are arranged electrically in parallel with pre-amplifier 1010-2 and main amplifier 1030-2 (which are electrically connected in series). As with the RF transistor amplifier 1000A of FIG. 7A, RF transistor amplifier 1000B may further include an input matching network that is interposed between RF input 1001 and pre-amplifiers 1010-1, 1010-2, and/or an output matching network that is interposed between the main amplifiers 1030-1, 1030-2 and the RF output 1002.

As shown in FIG. 7C, the RF transistor amplifiers according to some embodiments may also be used to implement Doherty amplifiers. As is known in the art, a Doherty amplifier circuit includes first and second (or more) power-combined amplifiers. The first amplifier is referred to as the "main" or "carrier" amplifier and the second amplifier is referred to as the "peaking" amplifier. The two amplifiers may be biased differently. For example, the main amplifier may comprise a Class AB or a Class B amplifier while the peaking amplifier may be a Class C amplifier in one common Doherty amplifier implementation. The Doherty amplifier may operate more efficiently than balanced amplifiers when operating at power levels that are backed off from saturation. An RF signal input to a Doherty amplifier is split (e.g., using a quadrature coupler), and the outputs of the two amplifiers are combined. The main amplifier is configured to turn on first (i.e., at lower input power levels) and hence only the main amplifier will operate at lower power levels. As the input power level is increased towards saturation, the peaking amplifier turns on and the input RF signal is split between the main and peaking amplifiers.

As shown in FIG. 7C, the Doherty RF transistor amplifier 1000C includes an RF input 1001, an input splitter 1003, a main amplifier 1040, a peaking amplifier 1050, an output combiner 1004 and an RF output 1002. The Doherty RF transistor amplifier 1000C includes a 90° transformer 1007 at the input of the peaking amplifier 1050 and a 90° transformer 1005 at the input of the main amplifier 1040, and may optionally include input matching networks and/or an output matching networks (not shown). The main amplifier 1040 and/or the peaking amplifier 1050 may be implemented using any of the above-described RF transistor amplifiers according to embodiments.

The RF transistor amplifiers according to embodiments may be formed as discrete devices, or may be formed as part of a Monolithic Microwave Integrated Circuit (MMIC). A MMIC refers to an integrated circuit that operates on radio and/or microwave frequency signals in which all of the circuitry for a particular function is integrated into a single semiconductor chip. An example MMIC device is a transistor amplifier that includes associated matching circuits, feed networks and the like that are all implemented on a common substrate. MMIC transistor amplifiers typically include a plurality of unit cell HEMT transistors that are connected in parallel.

Figure 8:
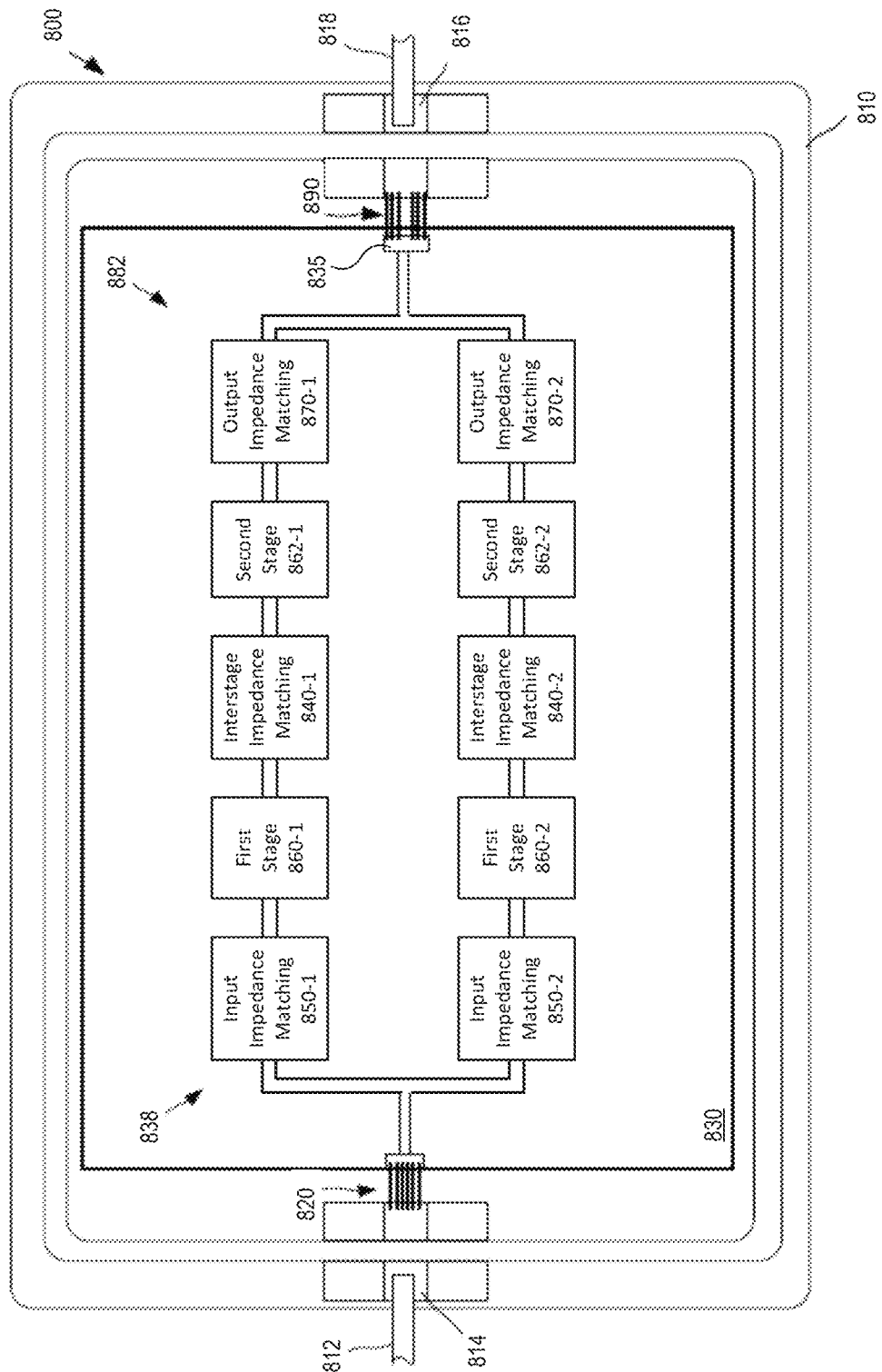
FIG. 8 is a plan view of a MMIC RF transistor amplifier according to some embodiments.

In some embodiments, the RF transistor dies 112 and/or auxiliary electronic devices 114 illustrated in FIGS. 1A to 5B may be provided in the form of a monolithic microwave integrated circuit (MMIC) RF transistor amplifier. For example a MMIC RF transistor amplifier may implement a circuit such as those illustrated in FIGS. 7A to 7C. FIG. 8 is a plan view of a MMIC RF transistor amplifier 800 according to some embodiments. As shown in FIG. 8, the MMIC RF transistor amplifier 800 includes an integrated circuit chip 830 that is contained within a package 810. The package 810 may comprise a protective housing that surrounds and protects the integrated circuit chip 830. The package 810 may be formed of, for example, a ceramic material. An encapsulant (not shown) may be formed over the integrated circuit chip 830 as described above.

The package 810 includes an input lead 812 and an output lead 818. The input lead 812 may be mounted to an input lead pad 814 by, for example, soldering. One or more input bond wires 820 may electrically connect the input lead pad 814 to an input bond pad on the integrated circuit chip 830.

The integrated circuit chip 830 includes an input feed network 838 that feeds parallel amplifier chains 825-1, 825-2 (similar to the amplifier circuit illustrated in FIG. 7B). In this example, each amplifier chain 825-1, 825-2 includes an input impedance matching network 850-1, 850-2, a first RF transistor amplifier stage 860-1, 860-2, an intermediate impedance matching network 840-1, 840-2, a second RF transistor amplifier stage 862-1, 862-2, and an output impedance matching stage 870-1, 870-2. An output feed network 882 connects the amplifier chains 825-1, 825-2 to an output bond pad 835 on the integrated circuit chip 830. The package 810 further includes an output lead 818 that is connected to an output lead pad 816 by, for example, soldering. One or more output bond wires 890 may electrically connect the output lead pad 816 to the output bond pad 835 on the integrated circuit chip 830.

The MMIC transistor amplifier 800 differs from the above-described discrete RF transistor amplifiers in that all of the circuitry is formed on a single semiconductor chip.

Figure 9:
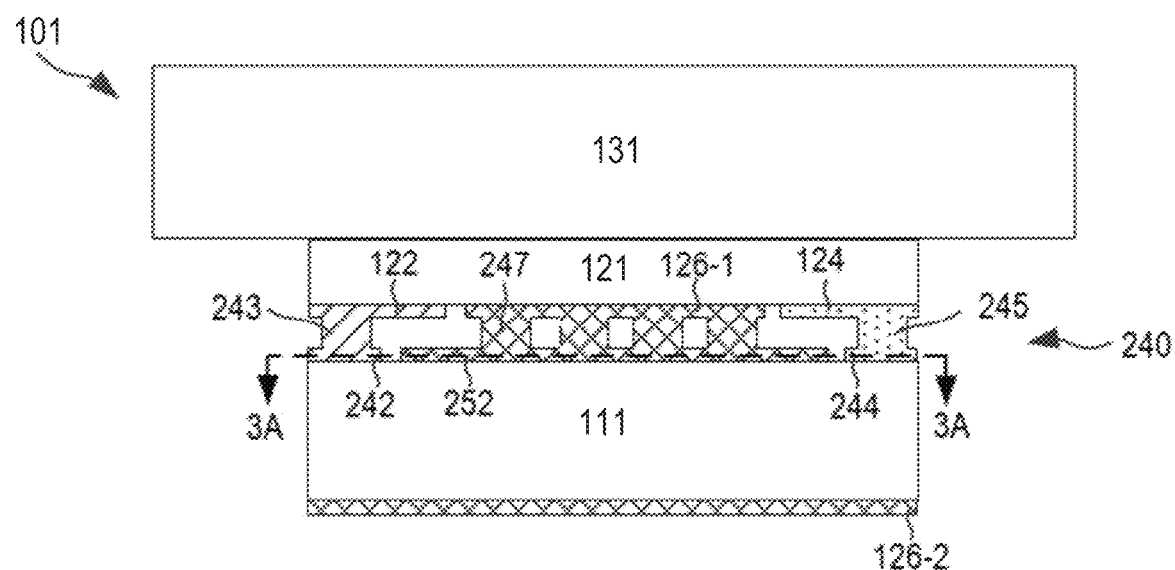
FIG. 9 is a schematic cross-sectional view of an RF transistor amplifier according to embodiments.

FIG. 9 is a schematic cross-sectional view of an RF transistor amplifier 101 that may be provided in a package according to some embodiments. As shown in FIG. 9, the RF transistor amplifier 101 includes an RF transistor amplifier die 111, an optional coupling element 121, and an interconnect structure 131.

The RF transistor amplifier die 111 may comprise a Group III nitride-based RF transistor amplifier die that includes a plurality of unit cell transistors (not shown). Each unit cell transistor may comprise a field effect transistor (e.g., a GaN HEMT transistor) that has a gate, drain and source. At least some of the unit cell transistors may be electrically connected in parallel. The RF transistor amplifier die 111 may include one or more gate terminals 122, one or more drain terminals 124 and one or more source terminals 126. Each of the gate terminal(s) 122, the drain terminal(s) 124, and the source terminal(s) 126 may be located on the top side of the RF transistor amplifier die 111 and/or on the bottom side of the RF transistor amplifier die 111. In the depicted embodiment, the gate terminal(s) 122, the drain terminal(s) 124, are illustrated as being located on the top side of the RF transistor amplifier die 111, and a pair of source terminals 126-1, 126-2 are provided that are on the top side and back side of the RF transistor die 111, respectively. It will be appreciated, however, that each of the gate terminals 122, the drain terminals 124 and the source terminals 126 may be on the top side of the RF transistor amplifier die 111, the bottom side of the RF transistor amplifier die 111, or both. Note that in the figures two-part reference numbers (e.g., source terminal 126-2) may be used to describe like elements, and the full reference numeral may be used to refer to a specific instance of the element, while the first part of the reference numeral may be used to refer to the elements collectively.

The coupling element 121, if included, may be mounted on the upper surface of the RF transistor amplifier die 111, and the interconnect structure 131 may be mounted on the upper surface of the coupling element 121. Thus, the coupling element 121 may be interposed between the RF transistor amplifier die 111 and the interconnect structure 131. In some embodiments, the coupling element 121 may comprise conductive structures (e.g., metal pillars and pads) that are formed during wafer level processing (i.e., before a semiconductor wafer that includes a plurality of RF transistor amplifier dies 111 is diced into individual RF transistor amplifier dies 111) using conventional semiconductor processing techniques and/or other methods. In such embodiments, underfill material such as capillary underfill material may be injected to fill in the space between the conductive structures of the coupling element 121. In other embodiments, the coupling element 121 may comprise a separate structure such as, for example, a redistribution layer ("RDL") laminate structure and/or an interposer, that is formed separately from the RF transistor amplifier die 111. In such embodiments, the coupling element 121 may be attached to the RF transistor amplifier die 111 either during a wafer level processing step (i.e., before the wafer is diced into individual RF transistor amplifier dies 111) or may be applied to an individual RF transistor amplifier die 111. It should be noted that even if the coupling element is formed as part of wafer level processing, it will be described herein as being a separate element from the RF transistor amplifier die 111 for convenience of description.

The interconnection structure 131 may comprise any structure that is electrically connected to the RF transistor amplifier die 111 that provides a suitable mounting surface for the RF transistor amplifier die 111. In some cases, the interconnection structure 131 may comprise an RDL laminate structure. An RDL laminate structure refers to a substrate that has conductive layer patterns and/or conductive vias for electrical and/or thermal interconnection. RDL laminate structures may be fabricated using semiconductor processing techniques by depositing conductive and insulating layers and/or patterns on a base material and by forming vias and copper routing patterns within the structure for transmitting signals through the RDL laminate structure. Other interconnection structures 131 may alternatively be used such as, for example, a printed circuit board (e.g., a multi-layer printed circuit board), a metal core printed circuit board, or a ceramic substrate that includes conductive vias and/or pads. In still other embodiments, the interconnection structure 131 may comprise a metal flange that has an insulating pattern (e.g., a solder mask layer) on a top surface thereof, and conductive traces on the insulating layer that, for example, provide electrical connections to one or more of the gate terminal 122, the drain terminal 124 and the source terminal(s) 126. In any event, it will be appreciated that the interconnection structure 131 may be any other suitable mounting surface for the RF transistor amplifier die 111 that can make electrical connections to the RF transistor amplifier die 111, either directly or through the coupling element 121 and/or other intervening elements. More than one interconnection structure 131 may be provided in a stacked manner. The RF transistor amplifier die 111 may be mounted on the interconnection structure 131 (e.g., on an RDL laminate structure) by the die manufacturer. In other cases, the RF transistor amplifier die 111 may be directly mounted in a package on a package submount, such as a metal flange, where dielectric and traces are formed on the metal flange so that the metal flange can act as interconnection structure 131. The interconnection structure 131 may be omitted in some embodiments (e.g., when the RF transistor amplifier die is mounted directly on a customer printed circuit board).

Figure 10A:
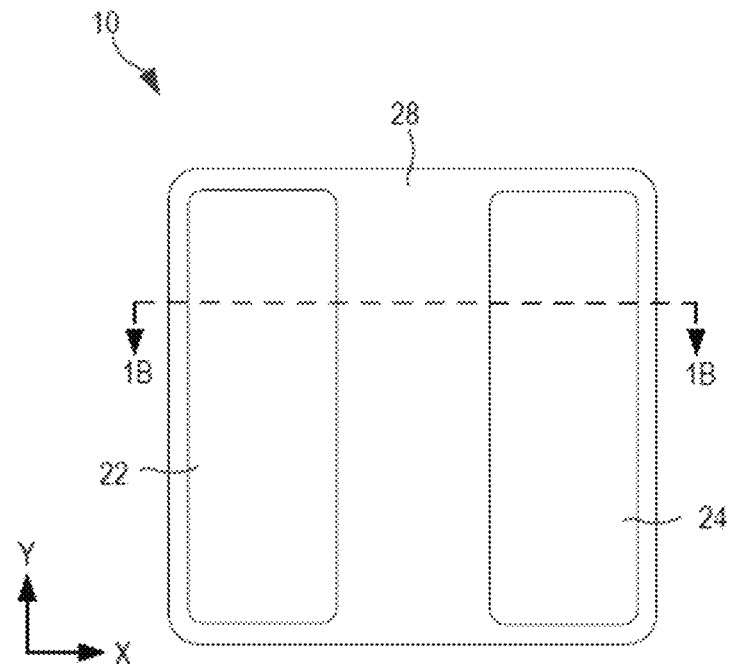
FIG. 10A is a schematic plan view of a Group III nitride-based RF transistor amplifier die.
Figure 10B:
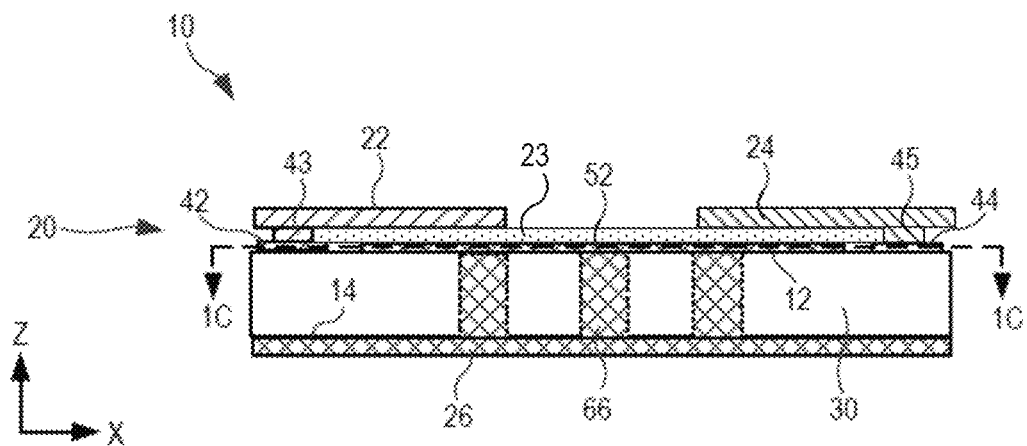
FIG. 10B is a schematic cross-sectional view taken along line 1B-1B of FIG. 10A.
Figure 10C:
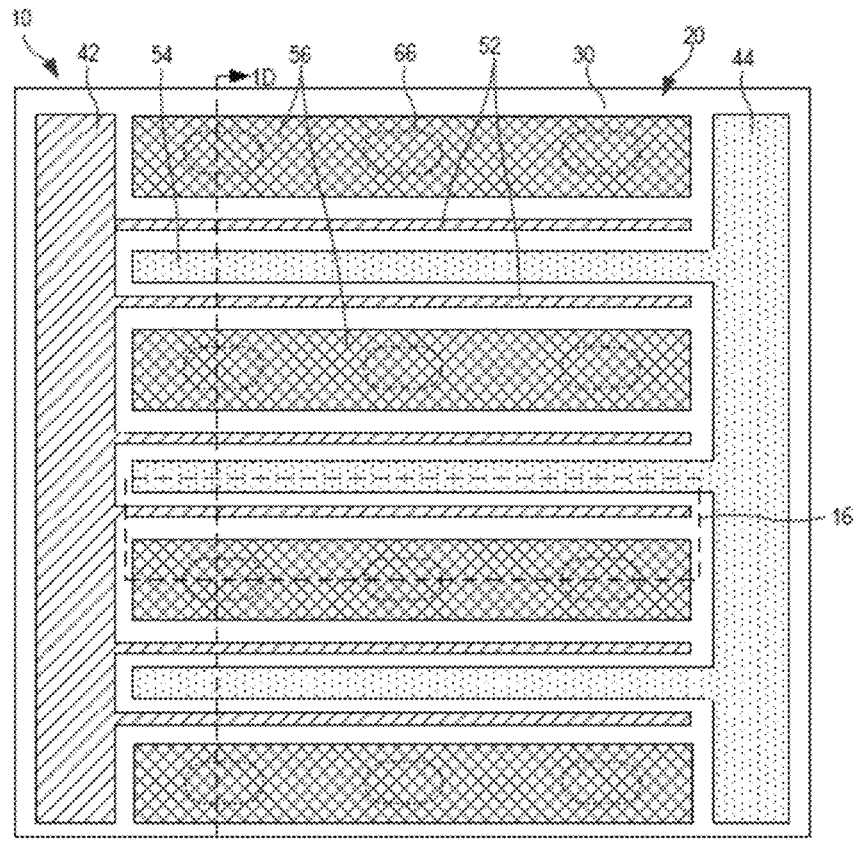
FIG. 10C is a schematic cross-sectional view taken along line 1C-1C of FIG. 10B that illustrates the metallization layers that are formed directly on the top surface of the semiconductor layer structure.
Figure 10D:
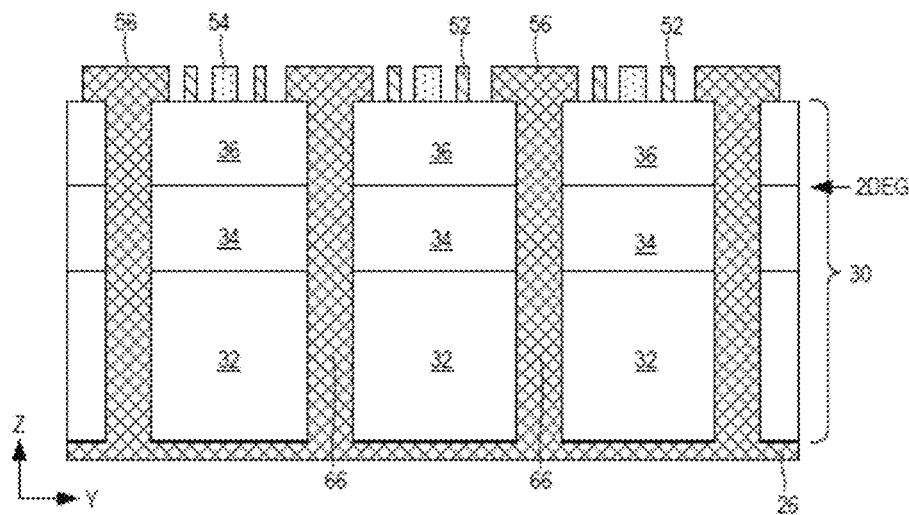
FIG. 10D is a schematic cross-sectional view taken along line 1D-1D of FIG. 10C.
Figure 10E:
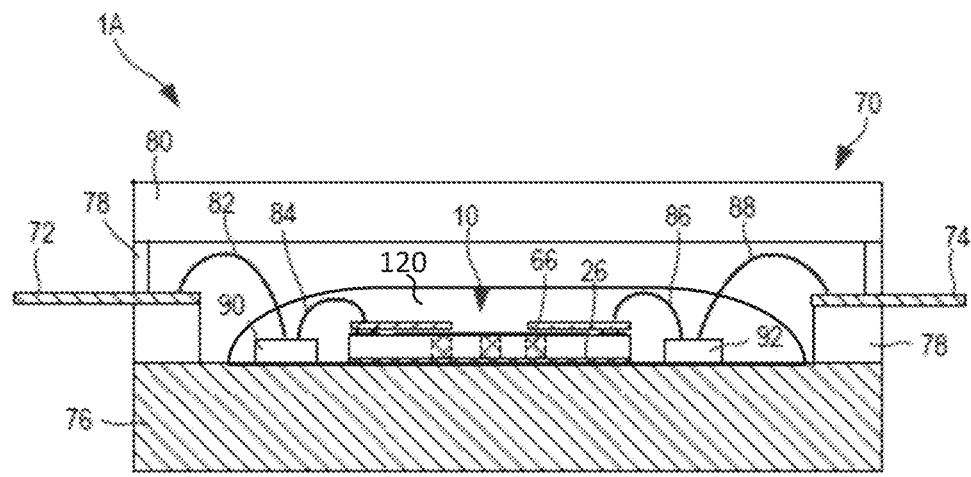
FIG. 10E is a schematic cross-sectional view of the Group III nitride-based RF transistor amplifier die of FIGS. 10A-10D packaged in a ceramic package in accordance with some embodiments.
Figure 10F:
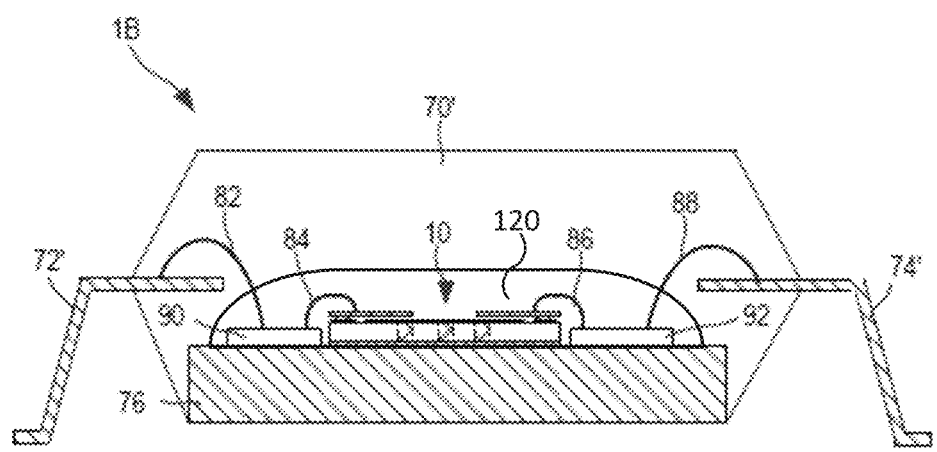
FIG. 10F is a schematic cross-sectional view of the Group III nitride-based RF transistor amplifier die of FIGS. 10A-10D packaged in an overmold package in accordance with some embodiments.

FIGS. 10A through 10D are various views that schematically illustrate a Group III nitride-based RF transistor amplifier die 10 that may be provided in a package according to embodiments. In particular, FIG. 10A is a schematic plan view of the Group III nitride-based RF transistor amplifier die 10, and FIG. 10B is a cross-sectional view of the RF transistor amplifier die 10 taken along line 1B-1B of FIG. 10A. FIG. 10C is a schematic cross-sectional view taken along line 1C-1C of FIG. 10B that shows the metallization on the top surface of the semiconductor layer structure of the RF transistor amplifier die 10, and FIG. 10D is a cross-sectional view of the RF transistor amplifier die 10 taken along line 1D-1D of FIG. 10C. FIGS. 10E and 10F are schematic cross-sectional views illustrating two example ways that the RF transistor amplifier die 10 of FIGS. 10A-10D may be packaged to provide packaged RF transistor amplifiers 1A and 1B, respectively. It will be appreciated that FIGS. 10A-10F (and many of the other figures of the present application) are highly simplified diagrams, and that actual RF transistor amplifiers may include many more unit cells and various circuitry and elements that are not shown in the simplified figures herein.

As shown in FIG. 10A, the RF transistor amplifier die 10 includes a gate terminal 22 and a drain terminal 24 that are exposed on the top side of the RF transistor amplifier die 10. First and second circuit elements (not shown) may be connected, respectively, to the gate terminal 22 and drain terminal 24 by, for example, bond wires (not shown). The first circuit element may, for example, pass an input RF signal that is to be amplified to the RF transistor amplifier die 10, and the second circuit element may receive an amplified RF signal that is output by the RF transistor amplifier die 10. A protective insulating layer or pattern 28 may cover the rest of the top surface of the RF transistor amplifier die 10.

Referring to FIGS. 10B-10D, the RF transistor amplifier die 10 includes a semiconductor layer structure 30, a top-side metallization structure 20 and a back side metallization structure that acts as a source terminal 26 for the RF transistor amplifier die 10.

The semiconductor layer structure 30 includes a plurality of semiconductor layers. The RF transistor amplifier die 10 may be a HEMT-based RF transistor amplifier die, and hence the semiconductor layer structure 30 may include at least a channel layer and a barrier layer (and typically additional layers are included in the semiconductor layer structure 30). Referring to FIG. 10D, in the depicted example, the semiconductor layer structure 30 includes a total of three layers, namely a growth substrate 32, a semiconductor channel layer 34 formed on the growth substrate 32, and a semiconductor barrier layer 36 formed on the channel layer 34 opposite the growth substrate 32. The growth substrate 32 may be a semiconductor or insulating substrate (such as a SiC or sapphire substrate). The growth substrate 32, even if formed of a non-semiconductor material, is considered to be part of the semiconductor layer structure 30.

Referring again to FIG. 10B, the semiconductor layer structure 30 has a top side 12 and a bottom side 14. The top side metallization structure 20 is formed on the top side 12 of the semiconductor layer structure 30 and the source terminal 26 is formed on the bottom side 14 of the semiconductor layer structure 30. The top side metallization structure 20 includes, among other things, a conductive (typically metal) gate manifold 42 and a conductive (typically metal) drain manifold 44, conductive gate and drain vias 43, 45, conductive gate and drain terminals 22, 24, and gate, drain and source fingers 52, 54, 56 (described below). A dielectric passivation layer 23 separates the gate and drain terminals from the substrate. Although a single dielectric passivation layer 23 is illustrated in FIG. 10B, more elaborate structures are possible. The gate manifold 42 is electrically connected to the gate terminal 22 through the gate vias 43, and the drain manifold 44 is electrically connected to the drain terminal 24 through the conductive drain vias 45. The gate and drain vias 43, 45 may comprise, for example, metal pillars that are formed through a dielectric material such as silicon oxide or silicon nitride.

As shown in FIG. 10C, the RF transistor amplifier die 10 comprises a plurality of unit cell transistors 16, one of which is indicated by the dashed box in FIG. 10C. Each unit cell transistor 16 includes a gate finger 52, a drain finger 54 and a source finger 56. The gate, drain and source fingers 52, 54, 56 are formed on the upper surface of the semiconductor layer structure 30 and comprise part of the top side metallization structure 20. The top side metallization structure 20 further includes the gate manifold 42 and the drain manifold 44. The gate fingers 52 are electrically connected to the gate manifold 42, and the drain fingers 54 are electrically connected to the drain manifold 44. The source fingers 56 are electrically connected to the source terminal 26 (FIG. 10B) by a plurality of conductive source vias 66 that extend through the semiconductor layer structure 30. The conductive source vias 66 may comprise metal-plated or metal-filled vias that extend completely through the semiconductor layer structure 30.

The unit cell transistors 16 may be HEMT devices. Suitable structures for Group III-nitride-based HEMT devices that may utilize embodiments are described, for example, in commonly assigned U.S. Patent Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Patent Publication No. 2002/0167023A1 for "Group-III Nitride Based High Electron Mobility Transistor (HEMT) With Barrier/Spacer Layer," published Nov. 14, 2002, U.S. Patent Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

As is further shown in FIG. 10C, a plurality of metal-plated source vias 66 may be provided that extend from the top metallization structure 40 through the semiconductor layer structure 30. The metal-plated source vias 66 physically and electrically connect the source fingers 56 to the source terminal 126-2 that is provided on the back side of the RF transistor amplifier die 10. The metal-plated source vias 266 may each be implemented by forming openings though the semiconductor layer structure (e.g., by anisotropic etching) and by then depositing metal-plating that coats the sidewalls of the openings. In some applications, the metal may completely fill the openings so that the metal-plated vias are metal-filled vias. However, in many applications, the RF transistor amplifier die 10 may operate over a wide temperature range (due to outdoor applications and/or the high levels of heat that may be generated within the RF transistor amplifier die during device operation), which may lead to high stress levels in the device due to the metal and semiconductor materials having significantly different coefficients of thermal expansion. In such cases, the center of the metal-plated vias 66 may be left open (i.e., air-filled) in order to reduce the amount of stress that occurs due to thermal cycling.

Referring to FIG. 10D, the semiconductor layer structure 30 includes a plurality of semiconductor layers. In the depicted embodiment, a total of two semiconductor layers are shown, namely a channel layer 34 and a barrier layer 36 that is on a top side of the channel layer 34. The semiconductor layer structure 30 may (and typically will) include additional semiconductor and/or non-semiconductor layers. For example, the semiconductor layer structure 30 may include a growth substrate 32 on which the other semiconductor layers are grown. The growth substrate 32 may comprise, for example, a 4H-SiC or 6H-SiC substrate. In other embodiments, the growth substrate may be comprise a different semiconductor material (e.g., silicon or a Group III nitride-based material, GaAs, ZnO, InP) or a non-semiconductor material (e.g., sapphire).

SiC has a much closer crystal lattice match to Group III nitrides than does sapphire ($Al_2O_3$), which is a very common substrate material for Group III nitride devices. The closer lattice match of SiC may result in Group III nitride films of higher quality than those generally available on sapphire. SiC also has a very high thermal conductivity so that the total output power of Group III nitride devices on silicon carbide is, typically, not as limited by thermal dissipation of the substrate as in the case of the same devices formed on sapphire. Also, the availability of semi-insulating SiC substrates may provide for device isolation and reduced parasitic capacitance.

Optional buffer, nucleation and/or transition layers (not shown) may be provided on the growth substrate 32 beneath the channel layer 34. For example, an AlN buffer layer may be included to provide an appropriate crystal structure transition between a SiC growth substrate 32 and the remainder of the semiconductor layer structure 30. Additionally, strain balancing transition layer(s) may also be provided as described, for example, in commonly assigned U.S. Patent Publication 2003/0102482A1, published Jun. 5, 2003, and entitled "Strain Balanced Nitride Heterojunction Transistors And Methods Of Fabricating Strain Balanced Nitride Heterojunction Transistors," the disclosure of which is incorporated herein by reference as if set forth fully herein.

In some embodiments, the channel layer 34 is a Group III nitride material, such as $Al_xGa_{1-x}N$ where 0≤x<1, provided that the energy of the conduction band edge of the channel layer 34 is less than the energy of the conduction band edge of the barrier layer 36 at the interface between the channel and barrier layers 34, 36. In certain embodiments, x=0, indicating that the channel layer 34 is gallium nitride ("GaN"). The channel layer 34 may also be other Group III nitrides such as InGaN, AlInGaN or the like. The channel layer 34 may be undoped or unintentionally doped and may be grown to a thickness of, for example, greater than about 20 Å. The channel layer 34 may also be a multi-layer structure, such as a superlattice or combinations of GaN, AlGaN or the like.

The channel layer 34 may have a bandgap that is less than the bandgap of at least a portion of the barrier layer 36, and the channel layer 34 may also have a larger electron affinity than the barrier layer 36. In certain embodiments, the barrier layer 36 is AlN, AlInN, AlGaN or AlInGaN with a thickness of between about 0.1 nm and about 10 nm or more. In particular embodiments, the barrier layer 36 is thick enough and has a high enough Al composition and doping to induce a significant carrier concentration at the interface between the channel layer 34 and the barrier layer 36.

The barrier layer 36 may be a Group III nitride and may have a bandgap larger than that of the channel layer 34 and a smaller electron affinity than the channel layer 34. Accordingly, in certain embodiments, the barrier layer 36 may include AlGaN, AlInGaN and/or AlN or combinations of layers thereof. The barrier layer 36 may, for example, be from about 0.1 nm to about 30 nm thick. In certain embodiments, the barrier layer 36 is undoped or doped with an n-type dopant to a concentration less than about $10^{19}$ cm$^{-3}$. In some embodiments, the barrier layer 36 is $Al_xGa_{1-x}N$ where 0<x<1. In particular embodiments, the aluminum concentration is about 25%. However, in other embodiments, the barrier layer 36 comprises AlGaN with an aluminum concentration of between about 5% and about 100%. In specific embodiments, the aluminum concentration is greater than about 10%.

Due to the difference in bandgap between the barrier layer 36 and the channel layer 34 and piezoelectric effects at the interface between the barrier layer 36 and the channel layer 34, a two dimensional electron gas (2DEG) is induced in the channel layer 34 at a junction between the channel layer 34 and the barrier layer 36. The 2DEG acts as a highly conductive layer that allows conduction between the source region of each unit cell transistor 16 and its associated drain region, where the source region is the portion of the semiconductor layer structure 30 that is directly underneath the source finger 56 and the drain region is the portion of the semiconductor layer structure 30 that is directly underneath the corresponding drain finger 54.

An interlayer insulating layer (not shown) is formed over the gate fingers 52, the drain fingers 54, and the source fingers 56. The interlayer insulating layer may include a dielectric material, such as SiN, $SiO_2$, etc.

FIG. 10E is a schematic side view of a packaged Group III nitride-based RF transistor amplifier 1A according to some embodiments that includes the RF transistor amplifier die 10 of FIGS. 10A-10D. As shown in FIG. 10E, packaged RF transistor amplifier 1A includes the RF transistor amplifier die 10 and an open cavity package 70. The package 70 includes metal gate leads 72, metal drain leads 74, a metal submount 76, ceramic sidewalls 78 and a ceramic lid 80.

The RF transistor amplifier die 10 is mounted on the upper surface of the metal submount 76 (which may be a metal flange) in a cavity defined by the metal submount 76, the ceramic sidewalls 78 and the ceramic lid 80. The source terminal 26 of the RF transistor amplifier die 10 may be mounted on the metal submount 76 using, for example, a conductive die attach material. The metal submount 76 may provide the electrical connection to the source terminal 26 and may also serve as a heat dissipation structure that dissipates heat that is generated in the RF transistor amplifier die 10. The heat is primarily generated in the upper portion of the RF transistor amplifier die 10 where relatively high current densities are generated in, for example, the channel regions of the unit cell transistors 16. This heat may be transferred though the source vias 66 and the semiconductor layer structure 30 to the source terminal 26 and then to the metal submount 76.

Input matching circuits 90 and/or output matching circuits 92 may also be mounted within the package 70. The matching circuits 90, 92 may include impedance matching and/or harmonic termination circuits. The impedance matching circuits may be used to match the impedance of the fundamental component of RF signals that are input to or output from the RF transistor amplifier 1A to the impedance at the input or output of the RF transistor amplifier die 10, respectively. The harmonic termination circuits may be used to ground harmonics of the fundamental RF signal that may be present at the input or output of the RF transistor amplifier die 10. More than one input matching circuit 90 and/or output matching circuit 92 may be provided. As schematically shown in FIG. 10E, the input and output matching circuits 90, 92 may be mounted on the metal submount 76. The gate lead 72 may be connected to the input matching circuit 90 by one or more first bond wires 82, and the input matching circuit 90 may be connected to the gate terminal 22 of RF transistor amplifier die 10 by one or more second bond wires 84. Similarly, the drain lead 74 may be connected to the output matching circuit 92 by one or more fourth bond wires 88, and the output matching circuit 92 may be connected to the drain terminal 24 of RF transistor amplifier die 10 by one or more third bond wires 86. The bond wires 82, 84, 86, 88, which are inductive elements, may form part of the input and/or output matching circuits. The gate lead 72 and the drain lead 74 may extend through the ceramic sidewalls 78. The interior of the package 70 may comprise an air-filled cavity.

An encapsulant material 120 is provided in the package on the submount 76 over the RF transistor amplifier die 10.

FIG. 10F is a schematic side view of another packaged Group III nitride-based RF transistor amplifier 1B according to some embodiments. RF transistor amplifier 1B differs from RF transistor amplifier 1A in that it includes a different package 70'. The package 70' includes a metal submount 76 (which acts as a metal heat sink and can be implemented as a metal slug), as well as gate and drain leads 72', 74'. An encapsulant material 120 is provided in the package on the submount 76 over the RF transistor amplifier die 10.

RF transistor amplifier 1B also includes a plastic overmold 78' that at least partially surrounds the RF transistor amplifier die 10 over the encapsulant material 120, the leads 72', 74' and the metal submount 76. Other components of RF transistor amplifier 1B may be the same as the like-numbered components of RF transistor amplifier 1A and hence further description thereof will be omitted.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the inventive concepts are described herein with reference to cross-section illustrations that are schematic illustrations of idealized embodiments (and intermediate structures) of the inventive concepts. The thickness of layers and regions in the drawings may be exaggerated for clarity. Additionally, variations from the shapes of the illustrations as a result, for example, of manufacturing techniques and/or tolerances, are to be expected. Thus, embodiments of the inventive concepts should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concepts.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed typical embodiments of the inventive concepts and, although specific terms are employed, they are used in a generic and descriptive sense only and not for purposes of limitation, the scope of the inventive concepts being set forth in the following claims.

What is claimed is:

1. A packaged semiconductor device, comprising:
a carrier substrate;
a plurality of semiconductor devices including a transistor device and an auxiliary electronic device, wherein the transistor device and the auxiliary electronic device are attached to the carrier substrate;
an encapsulant material over one of the transistor device and the auxiliary electronic device and not over the other of the transistor device and the auxiliary electronic device, the encapsulant material extending onto the carrier substrate, wherein the encapsulant material comprises a polytetrafluoroethylene (PTFE) based material; and
a protective structure on the carrier substrate over the transistor device and the auxiliary electronic device and the encapsulant material.

2. The packaged semiconductor device of claim 1, wherein the protective structure comprises a lid that forms a seal on the carrier substrate around the plurality of electronic devices and the encapsulant material.

3. The packaged semiconductor device of claim 2, wherein an open-cavity is present between the lid and the plurality of electronic devices.

4. The packaged semiconductor device of claim 1, wherein the protective structure comprises a plastic overmolding on the carrier substrate, wherein the plastic overmolding contacts the carrier substrate and covers the encapsulant material and the plurality of electronic devices.

5. The packaged semiconductor device of claim 4, wherein the plastic overmolding contacts the encapsulant material.

6. The packaged semiconductor device of claim 4, wherein the encapsulant material and the plastic overmolding have different coefficients of thermal expansion.

7. The packaged semiconductor device of claim 4, wherein the encapsulant material and the plastic overmolding have different hardness.

8. The packaged semiconductor device of claim 1, wherein the semiconductor die is attached to the carrier substrate with a sintered silver or eutectic die attach.

9. The packaged semiconductor device of claim 1, wherein the encapsulant material comprises silicone, polyimide, benzocyclobutene and/or epoxy resin.

10. The packaged semiconductor device of claim 1, wherein the semiconductor die is attached to the carrier substrate via solder bumps, and wherein the encapsulant material extends between the at least one of the plurality of electronic devices and the carrier substrate.

11. The packaged semiconductor device of claim 1, wherein the encapsulant material comprises an additive that modifies a dielectric constant of the encapsulant material.

12. The packaged semiconductor device of claim 1, wherein the semiconductor die comprises a high electron mobility transistor, a field effect transistor, a metal-oxide semiconductor field effect transistor, or a monolithic microwave integrated circuit.

13. The packaged semiconductor device of claim 1, wherein the semiconductor die comprises a GaN-based device or a SiC-based device.

14. The packaged semiconductor device of claim 1, wherein the semiconductor die comprises an RF transistor die having an operating frequency greater than 1 GHz.

15. A packaged semiconductor device, comprising:
a first electronic device and a second electronic device on a mounting surface;
an encapsulant material over one of the first electronic device and the second electronic device and not over the other of the first electronic device and the second electronic device, the encapsulant material extending onto the mounting surface, wherein the encapsulant material comprises a polytetrafluoroethylene (PTFE) based material; and
a protective structure on the carrier substrate over the first electronic device and the second electronic device and the encapsulant material.

16. The packaged semiconductor device of claim 15, further comprising a wirebond connecting the first electronic device and the second electronic device, wherein the wirebond extends through the encapsulant material.

17. The packaged semiconductor device of claim 15, wherein the mounting surface comprises a surface of a carrier substrate.

18. A packaged semiconductor device, comprising:
a carrier substrate;
a first electronic device and a second electronic device on the carrier substrate;
an encapsulant material over one of the first electronic device and the second electronic device and not over the other of the first electronic device and the second electronic device, the encapsulant material extending onto the carrier substrate, wherein the encapsulant material comprises a polytetrafluoroethylene (PTFE) based material; and
a lid on the carrier substrate over the first electronic device and the second electronic device and the encapsulant material, the lid defining an open-cavity above the carrier substrate, the first electronic device and the second electronic device.

19. The packaged semiconductor device of claim 18, wherein the lid is sealed to the carrier substrate.

* * * * *